United States Patent
Balasubramanian et al.

(10) Patent No.: US 11,924,966 B1
(45) Date of Patent: Mar. 5, 2024

(54) RECONFIGURABLE CIRCUIT DEVICES

(71) Applicant: Innovium, Inc., San Jose, CA (US)

(72) Inventors: Vittal Balasubramanian, San Jose, CA (US); Yongming Xiong, Fremont, CA (US); Keith Michael Ring, San Francisco, CA (US)

(73) Assignee: Innovium, Inc., San Jose, CA (US)

( * ) Notice: Subject to any disclaimer, the term of this patent is extended or adjusted under 35 U.S.C. 154(b) by 0 days.

(21) Appl. No.: 17/402,425

(22) Filed: Aug. 13, 2021

Related U.S. Application Data

(60) Provisional application No. 63/220,157, filed on Jul. 9, 2021.

(51) Int. Cl.
*H05K 1/02* (2006.01)
*G06F 30/394* (2020.01)
*H01L 23/66* (2006.01)

(52) U.S. Cl.
CPC ......... *H05K 1/0243* (2013.01); *G06F 30/394* (2020.01); *H01L 23/66* (2013.01); *H05K 1/0251* (2013.01); *H05K 2201/10356* (2013.01); *H05K 2201/10689* (2013.01)

(58) Field of Classification Search
USPC ........................................................ 716/136
See application file for complete search history.

(56) References Cited

U.S. PATENT DOCUMENTS

| | | | | |
|---|---|---|---|---|
| 8,151,455 B2 * | 4/2012 | Hamada | .................. | H05K 3/429 |
| | | | | 29/853 |
| 2003/0201462 A1 * | 10/2003 | Pommer | .............. | G02B 6/4259 |
| | | | | 257/200 |
| 2004/0188138 A1 * | 9/2004 | Baras | .................. | H05K 1/0216 |
| | | | | 174/261 |
| 2007/0181337 A1 * | 8/2007 | Miller | .................. | H01R 9/0515 |
| | | | | 174/261 |
| 2012/0014080 A1 * | 1/2012 | Feng | ..................... | G06F 30/392 |
| | | | | 174/268 |

(Continued)

FOREIGN PATENT DOCUMENTS

JP     2009004585 A     1/2009

OTHER PUBLICATIONS

Fei, "Methods of Optimized via Design for Higher Channel Bandwidth," Fifth Asia Symp. on Quality Electronic Design (ASQED 2013), Penang, Malaysia, pp. 170-177 (2013).

(Continued)

*Primary Examiner* — Mohammed Alam

(57) ABSTRACT

Loss reduction methods are described. A first transmission loss associated with signal transmission through a trace in a first circuit board design is determined. The trace is routed from an integrated circuit disposed on a circuit board to a circuit element disposed on the circuit board. It is determined that the first transmission loss is greater than a threshold transmission loss. The first circuit board design is altered to obtain a second circuit board design. In the second circuit board design, the trace is routed from the integrated circuit to a connector disposed on the circuit board, and the connector is electrically coupled to the circuit element by a cable. A second transmission loss associated with signal transmission between the integrated circuit and the circuit element in the second circuit board design is less than the threshold transmission loss.

9 Claims, 24 Drawing Sheets

(56) References Cited

U.S. PATENT DOCUMENTS

| | | | |
|---|---|---|---|
| 2012/0176756 A1* | 7/2012 | Gailus | H01R 24/64 361/752 |
| 2019/0051587 A1* | 2/2019 | Azeroual | H01L 21/4857 |
| 2020/0375024 A1* | 11/2020 | Kim | H05K 3/4007 |

OTHER PUBLICATIONS

U.S. Appl. No. 17/402,455, entitled "Mezzanine Board Circuit for Reducing Signal Loss in PCBS," filed Aug. 13, 2021.
U.S. Appl. No. 17/402,444, entitled "Configurable via Structure for PCBS," filed Aug. 13, 2021.

* cited by examiner

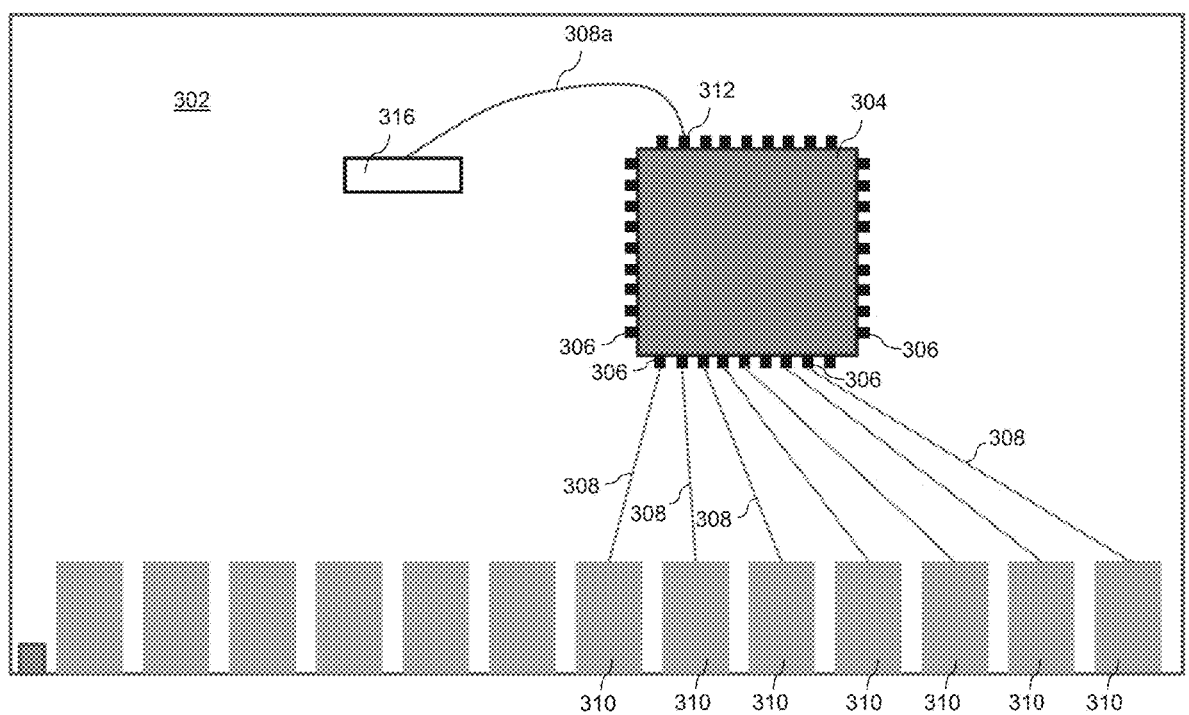

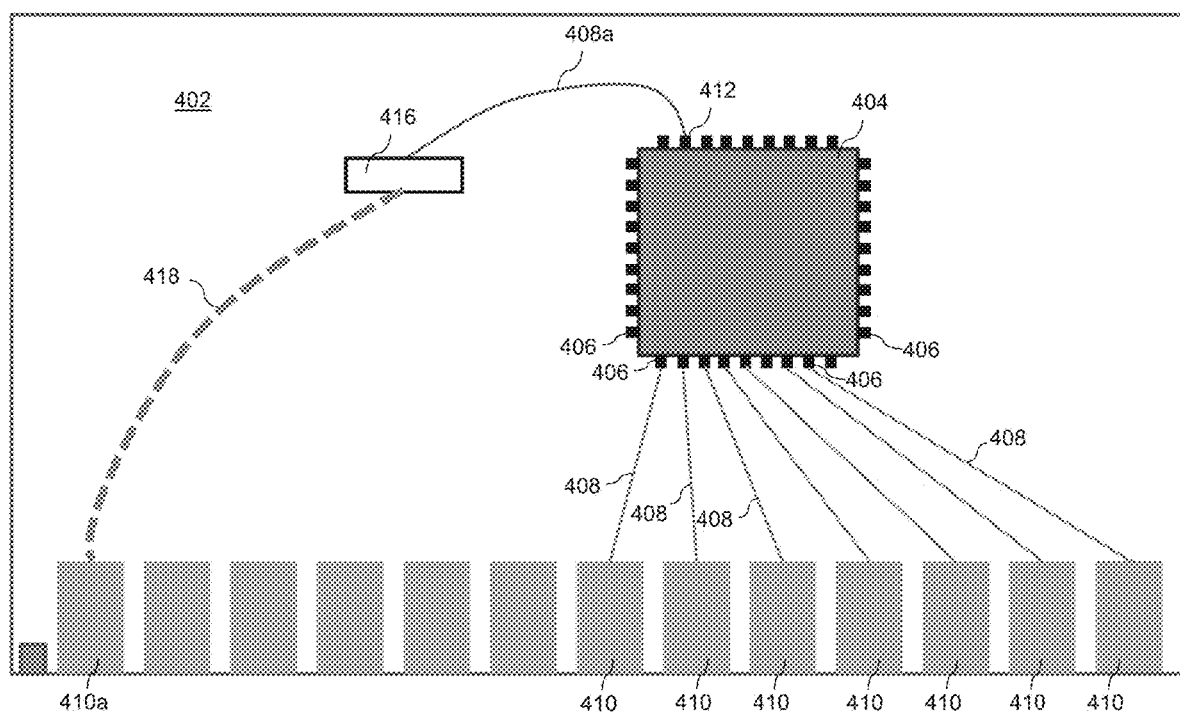

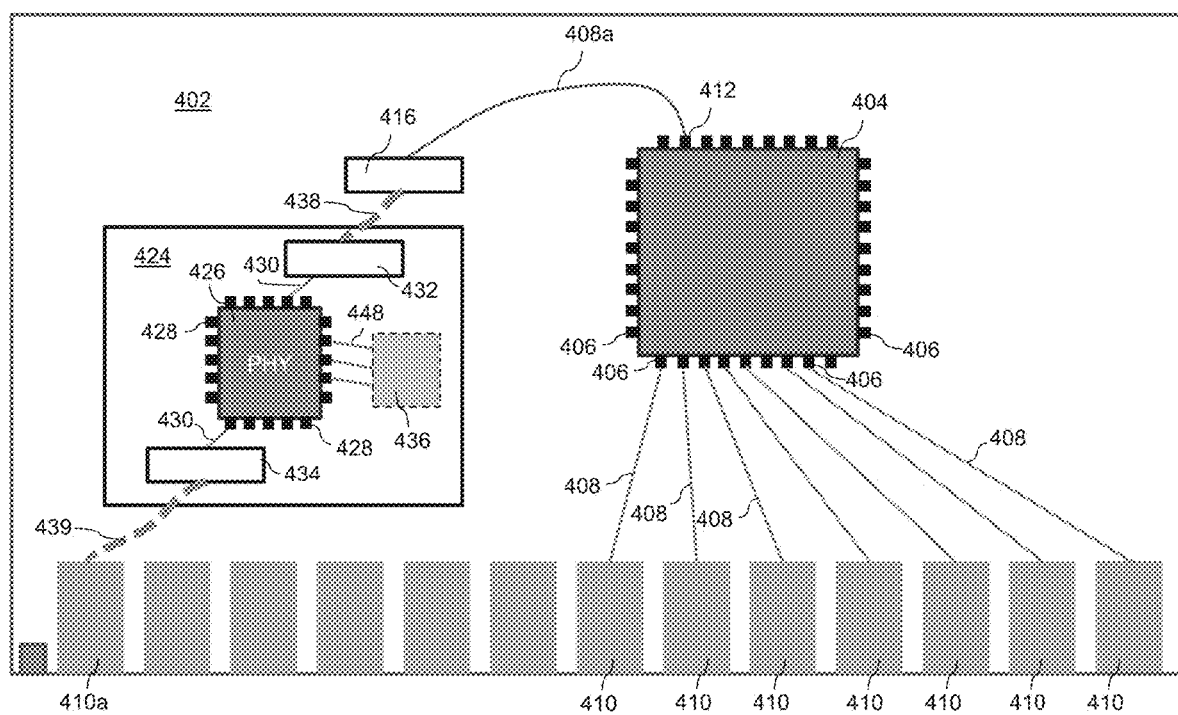

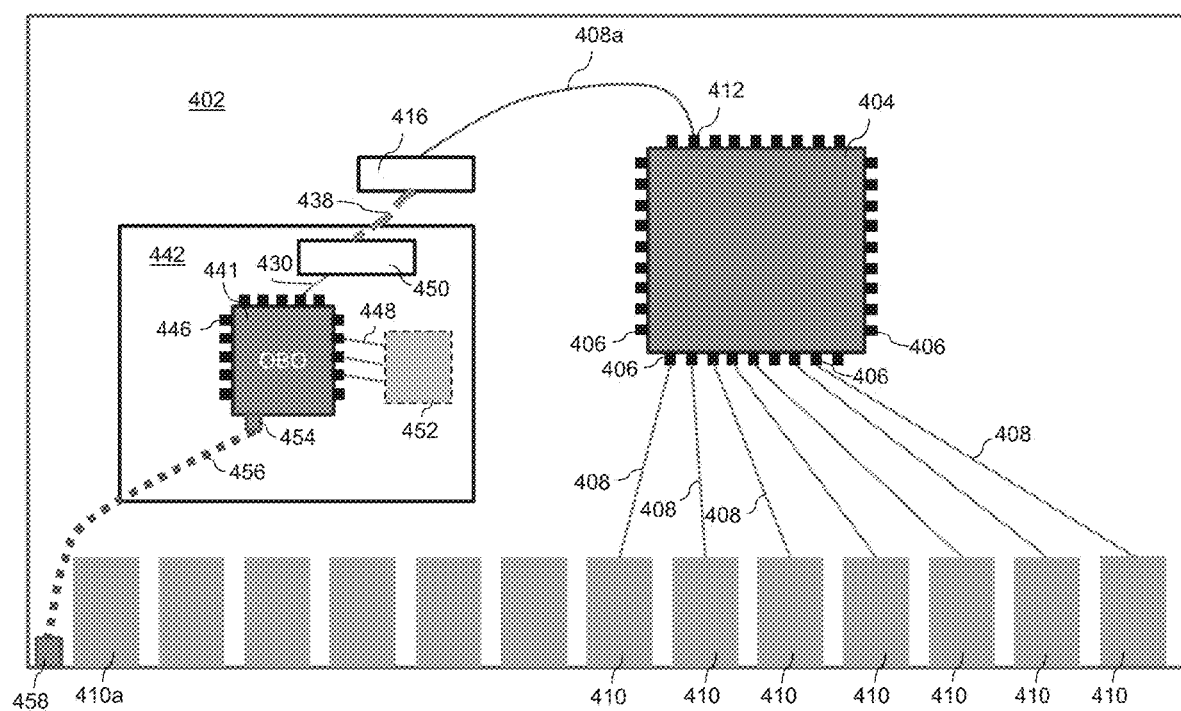

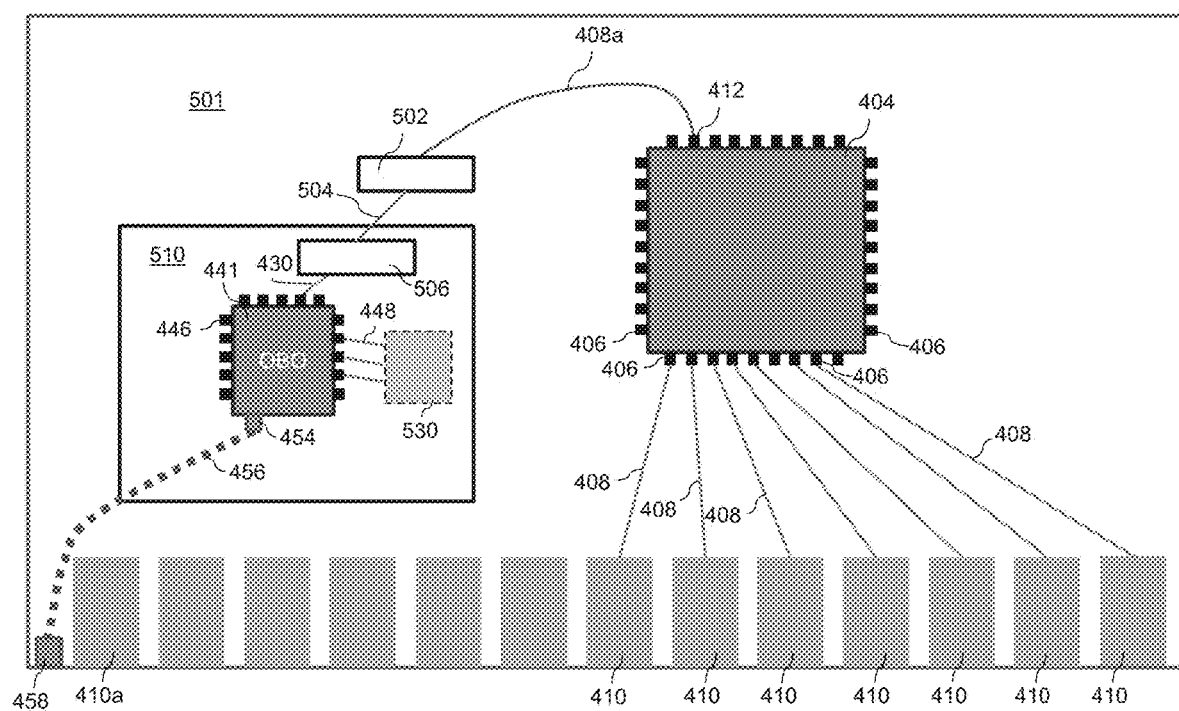

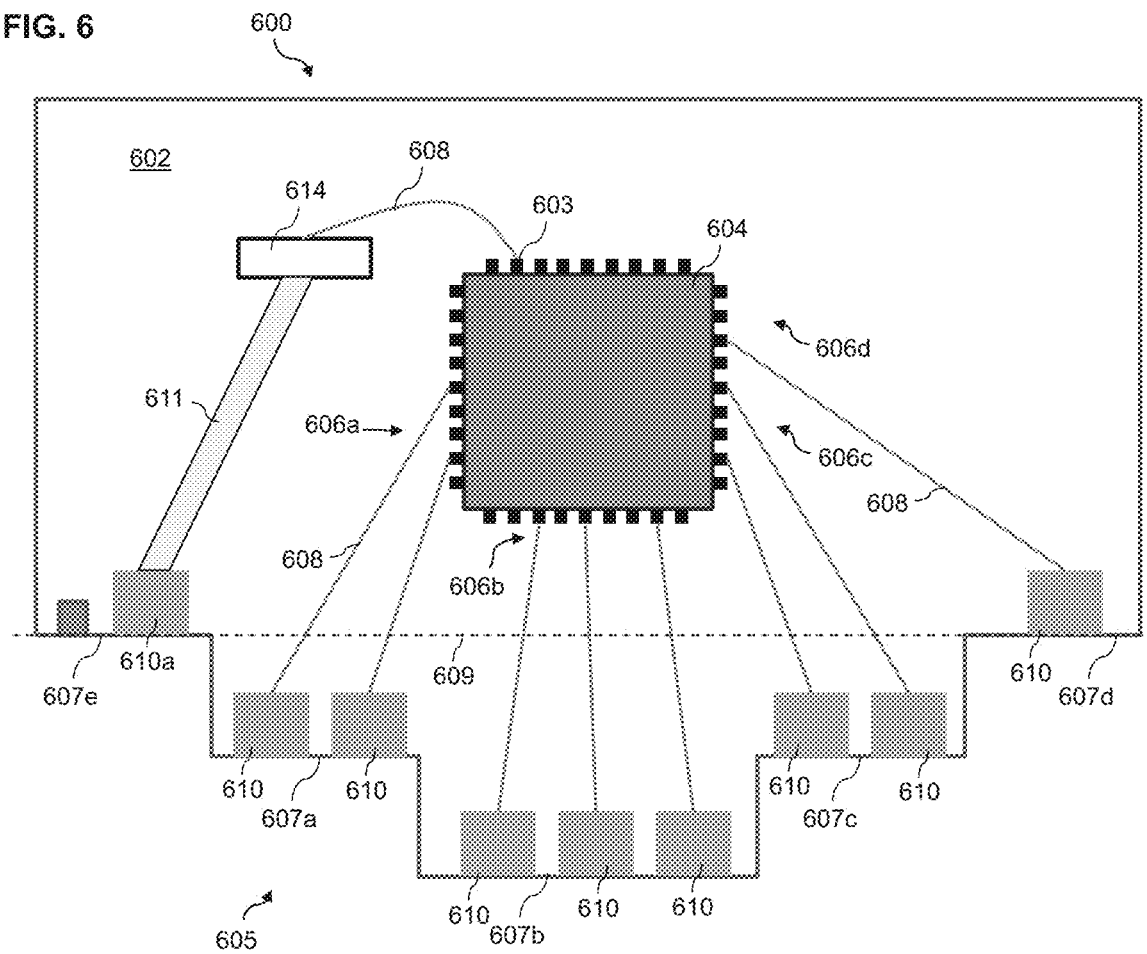

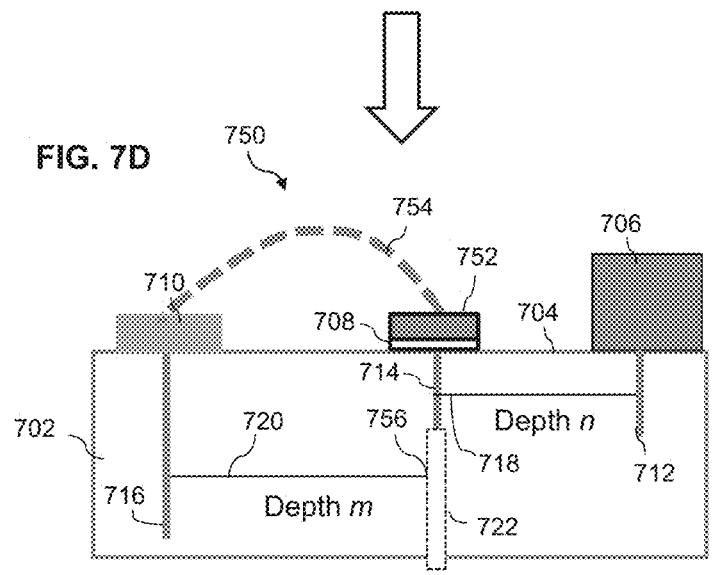

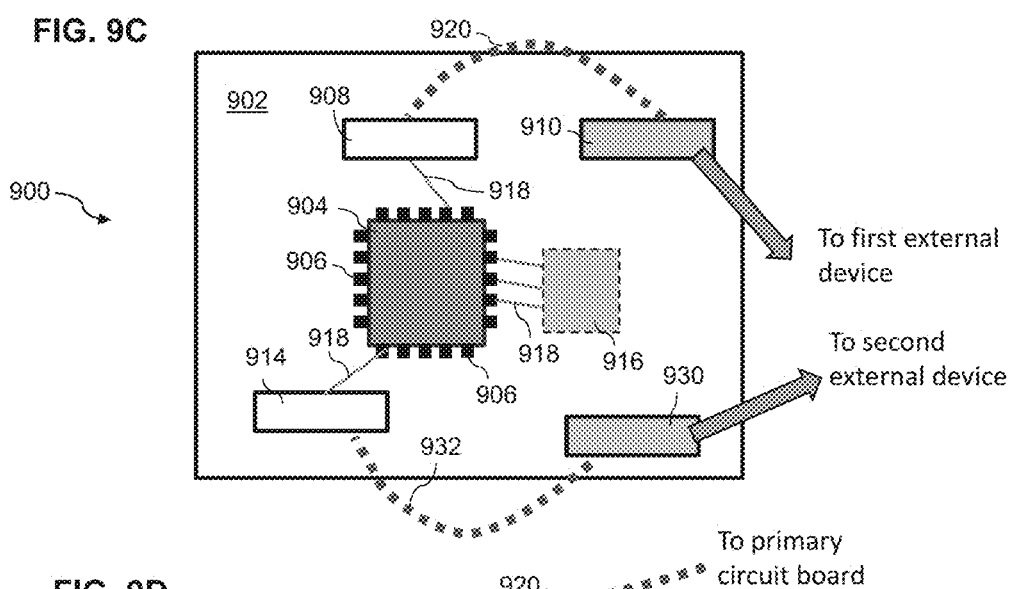
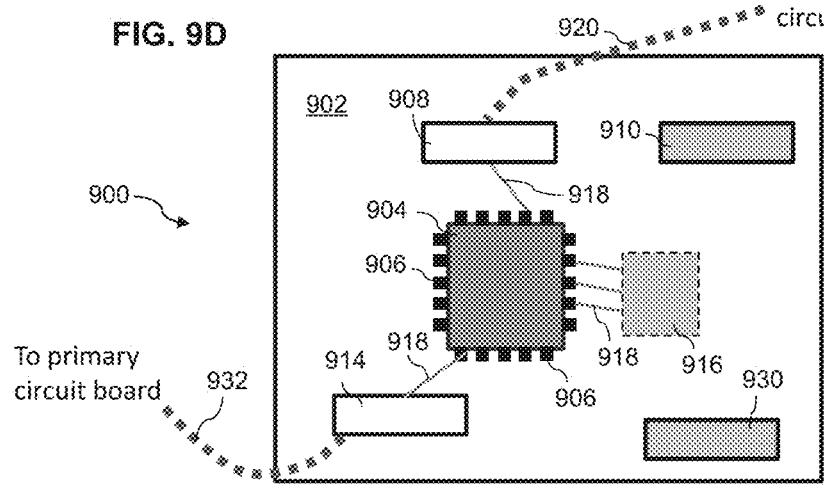

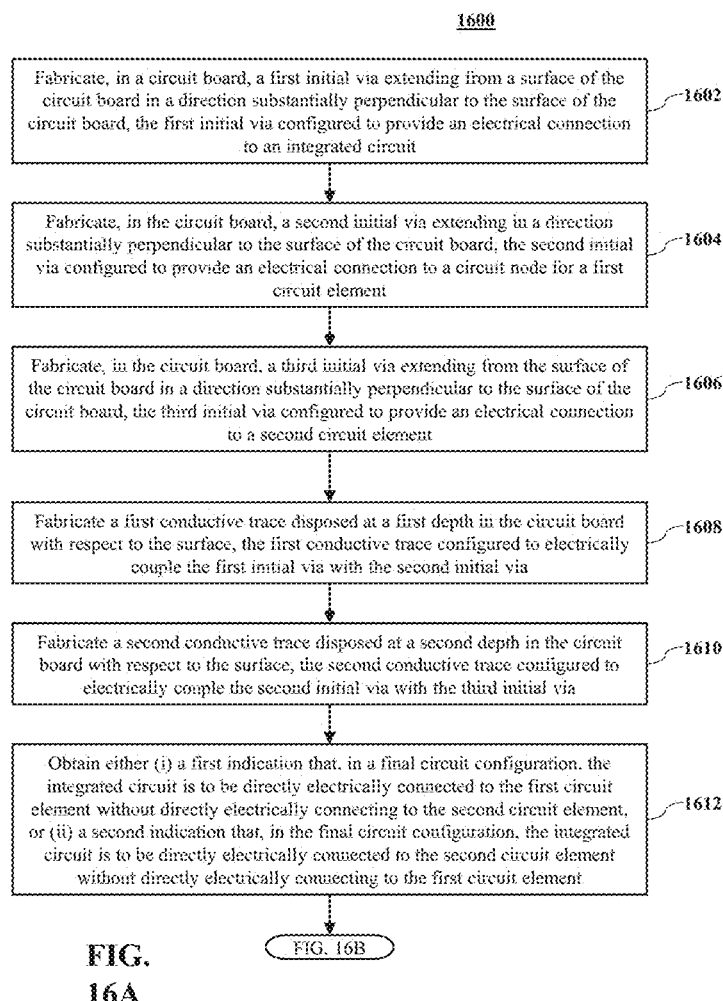

( Fig. 16A )

In response to obtaining the first indication that the integrated circuit is to be directly electrically connected to the first circuit element, remove, by drilling, a first portion of the second initial via such that an electrical connection between the first conductive trace and the second conductive trace is severed, or in response to obtaining the second indication that the integrated circuit is to be directly electrically connected to the second circuit element, remove, by drilling, a second portion of the second initial via such that an electrical connection between the first conductive trace and the circuit node is severed. ⟋1614

FIG. 16B

RECONFIGURABLE CIRCUIT DEVICES

CROSS-REFERENCE TO RELATED APPLICATION

This application claims the benefit of U.S. Provisional Application No. 63/220,157, filed Jul. 9, 2021, and titled "Reconfigurable Circuit Devices," which is incorporated by reference.

FIELD OF THE DISCLOSURE

The present disclosure relates to circuit devices, including circuit devices configured for network interfacing.

BACKGROUND

High-speed data transmission is performed through both external connections between separate devices (e.g., units in server racks) and internal connections within devices. Signals may experience loss during transmission.

SUMMARY

In one aspect, the present disclosure describes a loss reduction method. In the loss reduction method, a first transmission loss associated with signal transmission through a trace in a first circuit board design is determined. In the first circuit board design, the trace is routed from an integrated circuit disposed on a circuit board to a circuit element disposed on the circuit board. It is determined that the first transmission loss is greater than a threshold transmission loss. In response to determining that the first transmission loss is greater than the threshold transmission loss, the first circuit board design is altered to obtain a second circuit board design. In the second circuit board design, the trace is routed from the integrated circuit to a connector disposed on the circuit board, and the connector is electrically coupled to the circuit element by a cable. A second transmission loss associated with signal transmission between the integrated circuit and the circuit element in the second circuit board design is less than the threshold transmission loss.

Implementations of this or other methods may have any one or more of at least the following characteristics.

In some implementations, the second transmission loss is less than 6.875 dB for network transmission signals having a speed of at least 112 Gbit/second.

In some implementations, the second transmission loss is less than 4.875 dB for network transmission signals having a speed of at least 112 Gbit/second.

In some implementations, the method includes altering the second circuit board design to obtain a third circuit board design. In the third circuit board design, a second circuit element is electrically coupled between the connector and the circuit element. The second circuit element contributes net transmission loss to signal transmission between the integrated circuit and the circuit element. A third transmission loss associated with signal transmission between the integrated circuit and the circuit element in the third circuit board design, including the net transmission loss contributed by the second circuit element, is less than the threshold transmission loss.

In some implementations, altering the first circuit board design to obtain the second circuit board design includes locating the connector closer to the integrated circuit than to the circuit element.

In some implementations, altering the first circuit board design to obtain the second circuit board design includes locating the connector such that a third signal transmission loss associated with signal transmission between the integrated circuit and the connector is less than a second threshold transmission loss.

In some implementations, a difference between the threshold transmission loss and the second threshold transmission loss is greater than or equal to a fourth signal transmission loss associated with operation of a circuit device that is connectable to the connector by the cable.

In some implementations, the connector includes a trace-to-cable connector.

In some implementations, the circuit element includes an input/output (I/O) port.

In another aspect, this disclosure describes a circuit system. The circuit system includes a first circuit board; a first integrated circuit mounted on the first circuit board, the first integrated circuit including a plurality of pins; a plurality of input/output (I/O) ports disposed on the first circuit board and configured to connect to one or more external devices; a first connector disposed on the first circuit board, the first connector configured to receive at least one of (i) a first external cable or (ii) a connection to a second circuit board; and a first conductive trace coupling a first subset of the plurality of pins to the first connector.

Implementations of this or other systems may have any one or more of at least the following characteristics.

In some implementations, the circuit system includes at least a second conductive trace disposed on the first circuit board, the second conductive trace coupling a second subset of the plurality of pins to a subset of the plurality of I/O ports.

In some implementations, the first integrated circuit is configured to output network communication signals at a rate of at least 112 Gbit/second. Transmission losses, at the rate of at least 112 Gbit/second, from the second subset of the plurality of pins to the subset of the plurality of I/O ports are less than 6.875 dB.

In some implementations, the transmission losses are less than 4.875 dB.

In some implementations, the first connector includes a trace-to-cable connector.

In some implementations, first connector is configured to receive the connection to the second circuit board, and the circuit system further includes the second circuit board removably coupled to the first circuit board through the first connector.

In some implementations, the second circuit board includes a second integrated circuit; a second connector disposed on the second circuit board, the second connector configured to receive the first external cable; and a second conductive trace coupling the second integrated circuit to the second connector.

In some implementations, the second circuit board further includes a third connector disposed on the second circuit board, the third connector configured to receive a second external cable of the same cable-type as the first external cable.

In some implementations, the circuit system includes a third conductive trace on the second circuit board, the third conductive trace connecting the second integrated circuit to the third connector.

In some implementations, the circuit system includes an optical port mounted on the first circuit board, the optical port configured to connect to one or more additional external devices. The second integrated circuit includes an electro-optical device configured to couple to the optical port through an optical fiber.

In some implementations, the first external cable is a Twinaxial cable.

In some implementations, the second circuit board includes a second integrated circuit; a second connector disposed on the second circuit board, the second connector configured to removably connect to the first connector of the first circuit board in a mating configuration; and a second conductive trace coupling the second integrated circuit to the second connector.

In some implementations, the second circuit board includes a third connector disposed on the second circuit board, the third connector configured to receive a second external cable.

In some implementations, the circuit system includes a third conductive trace on the second circuit board, the third conductive trace connecting the second integrated circuit to the third connector.

In some implementations, the circuit system further includes an optical port mounted on the first circuit board, the optical port configured to connect to one or more additional external devices. The second integrated circuit includes an electro-optical device configured to couple to the optical port through an optical fiber.

In some implementations, a first subset of the plurality of I/O ports are disposed along a first edge of the first circuit board, and at least a second subset of the plurality of I/O ports are disposed along a second edge of the first circuit board, the second edge being different from the first edge.

In some implementations, the first conductive trace is disposed at a first depth in the first circuit board, and the first integrated circuit is connected to the first conductive trace by a first via. The circuit system includes a second via disposed between the first conductive trace and the first connector and a second conductive trace disposed at a second depth in the first circuit board, the second conductive trace extending from one of the plurality of I/O ports to a floating end, the second depth being different from the first depth.

In some implementations, the first integrated circuit forms a portion of a network switching device.

In some implementations, the second circuit board is configured to amplify a signal received thorough the first connector.

In some implementations, the second circuit board includes an integrated circuit configured to implement one or more physical layer functions of a network interface controller.

In another aspect, this disclosure describes a circuit fabrication method. In the method, in a circuit board, a first initial via is fabricated extending from a surface of the circuit board in a direction substantially perpendicular to the surface of the circuit board, the first initial via configured to provide an electrical connection to an integrated circuit. In the circuit board, a second initial via is fabricated extending in a direction substantially perpendicular to the surface of the circuit board, the second initial via configured to provide an electrical connection to a circuit node for a first circuit element. In the circuit board, a third initial via is fabricated extending from the surface of the circuit board in a direction substantially perpendicular to the surface of the circuit board, the third initial via configured to provide an electrical connection to a second circuit element. A first conductive trace is fabricated disposed at a first depth in the circuit board with respect to the surface, the first conductive trace configured to electrically couple the first initial via with the second initial via. A second conductive trace is fabricated disposed at a second depth in the circuit board with respect to the surface, the second conductive trace configured to electrically couple the second initial via with the third initial via. Either (i) a first indication is obtained that, in a final circuit configuration, the integrated circuit is to be directly electrically connected to the first circuit element without directly electrically connecting to the second circuit element, or (ii) a second indication is obtained that, in the final circuit configuration, the integrated circuit is to be directly electrically connected to the second circuit element without directly electrically connecting to the first circuit element. In response to obtaining the first indication that the integrated circuit is to be directly electrically connected to the first circuit element, a first portion of the second initial via is removed by drilling, such that an electrical connection between the first conductive trace and the second conductive trace is severed. Or, in response to obtaining the second indication that the integrated circuit is to be directly electrically connected to the second circuit element, a second portion of the second initial via is removed by drilling, such that an electrical connection between the first conductive trace and the circuit node is severed.

Implementations of this or other methods may have any one or more of at least the following characteristics.

In some implementations, the method includes removing, by drilling, a stub portion of the first initial via or a stub portion of the third initial via.

In some implementations, the method includes mounting the integrated circuit and the second circuit element on the circuit board.

In some implementations, the method includes obtaining the first indication that the integrated circuit is to be directly electrically connected to the first circuit element, and the method further includes mounting the first circuit element on the circuit board.

In some implementations, the first circuit element includes a trace-to-cable connector.

In some implementations, the first circuit element includes a trace-to-board connector.

In some implementations, obtaining the first indication that the integrated circuit is to be directly electrically connected to the first circuit element includes determining a transmission loss associated with signal transmission from the integrated circuit to the second circuit element through the first conductive trace and the second conductive trace; determining that the transmission loss is greater than a threshold transmission loss; and in response to determining that the transmission loss is greater than the threshold transmission loss, determining that the integrated circuit is to be directly electrically connected to the first circuit element.

In some implementations, the second initial via extends from the surface of the circuit board.

In some implementations, the second initial via includes the circuit node for the first circuit element.

In some implementations, the method includes fabricating, in the circuit board, a fourth initial via extending from the surface of the circuit board in a direction substantially perpendicular to the surface of the circuit board, the fourth initial via including the circuit node for the first circuit element.

In some implementations, the method includes fabricating, in the circuit board, a third conductive trace disposed at a third depth in the circuit board with respect to the surface, the third conductive trace configured to electrically couple the second initial via to the fourth initial via.

In some implementations, the second circuit element includes an input/output (I/O) port.

In another aspect, this disclosure describes another circuit fabrication method. In the method, a circuit system is designed including a circuit board, an integrated circuit disposed on a surface of the circuit board, and a second circuit element disposed on the surface of the circuit board. The integrated circuit and the second circuit element are electrically coupled to respective conductive traces that connect to a first initial via extending in a direction substantially perpendicular to the surface of the circuit board, and the first initial via is electrically coupled to a circuit node configured to connect to a first circuit element disposed on the surface of the circuit board. The circuit board, the respective traces, the first initial via, and an electrical connection from the first initial via to the circuit node are fabricated. Either (i) a first indication is obtained that, in a final circuit configuration, the integrated circuit is to be directly electrically connected to the first circuit element without directly connecting to the second circuit element, or (ii) a second indication is obtained that, in the final circuit configuration, the integrated circuit is to be directly electrically connected to the second circuit element without directly connecting to the first circuit element. In response to obtaining the first indication that the integrated circuit is to be directly electrically connected to the first circuit element, a first portion of the first initial via is removed by drilling, such that a first conductive trace configured to electrically couple to the integrated circuit is disconnected from a second conductive trace configured to electrically couple to the second circuit element. Or, in response to obtaining the second indication that the integrated circuit is to be directly electrically connected to the second circuit element, a second portion of the first initial via is removed by drilling, such that the electrical connection between the first initial via and the circuit node is severed.

In another aspect, this method describes another circuit system. The circuit system includes a first circuit board including a substrate. The first circuit board includes at least a first circuit element, a second circuit element, and a third circuit element, each of which is disposed, at least in part, on a first surface of the substrate. The circuit system includes a connection path extending from the second circuit element into the substrate, the connection path including conductive material in at least a portion of the connection path. The circuit system includes a first conductive trace disposed at a first depth within the substrate with respect to the first surface of the substrate, the first conductive trace extending from (i) a first via coupled to the first circuit element to (ii) the connection path. The circuit system includes a second conductive trace disposed at a second depth within the substrate with respect to the first surface of the substrate, the second depth being larger than the first depth, the second conductive trace extending from (i) the connection path to (ii) a second via coupled to the third circuit element. The conductive material in the portion of the connection path provides an electrical connection between (i) the first conductive trace and the second circuit element, (ii) the first conductive trace and the second conductive trace, or (iii) the first conductive trace, the second conductive trace, and the second circuit element.

Implementations of this or other systems may have any one or more of at least the following characteristics.

In some implementations, the first circuit element is configured to receive a connection to an integrated circuit.

In some implementations, the first circuit element includes an integrated circuit.

In some implementations, the second circuit element is configured to receive a connection to a connector disposed on the first surface, the connector configured to receive one or both of (i) an external cable or (ii) a connection to a second circuit board.

In some implementations, the second circuit element includes a connector disposed on the first surface, the connector configured to receive one or both of (i) an external cable or (ii) a connection to a second circuit board.

In some implementations, at least one of the first circuit element, the second circuit element, or the third circuit element includes a portion of conductive material.

In some implementations, the portion of conductive material is configured to receive a soldered or bonded connection.

In some implementations, at least one of the first circuit element, the second circuit element, or the third circuit element includes a connection pad or a bonding pad.

In some implementations, the third circuit element is configured to receive a connection to an input/output (I/O) port.

In some implementations, the third circuit element includes an input/output (I/O) port.

In some implementations, the conductive material in the portion of the connection path provides an electrical connection between (i) the first conductive trace and the second circuit element, but not between (ii) the first conductive trace and the second conductive trace, and the second circuit element includes a trace-to-cable connector configured to receive an external cable.

In some implementations, the external cable includes a Twinaxial cable.

In some implementations, the conductive material in the portion of the connection path provides an electrical connection between (i) the first conductive trace and the second conductive trace, but not between (ii) the first conductive trace and a third via coupled to the second circuit element.

In another aspect, this disclosure describes another circuit system. The circuit system includes a substrate includes at least a first circuit element and a second circuit element, each of which is disposed, at least in part, on a first surface of the substrate. The circuit system includes a first conductive trace disposed at a first depth within the substrate with respect to the first surface of the substrate, the first conductive trace extending from (i) a first via coupled to the first circuit element to (ii) a first location within the substrate. The circuit system includes a second conductive trace disposed at a second depth within the substrate with respect to the first surface of the substrate, the second depth being larger than the first depth, the second conductive trace extending from (i) a second location within the substrate to (ii) a second via coupled to the second circuit element. The circuit system includes a connection path extending from the first surface into the substrate or from an opposite, second surface, into the substrate, and passing through the first location and the second location within the substrate, the connection path including a conductive material in a portion of the connection path, such that the first conductive trace is electrically connected to the second conductive trace.

Implementations of this or other systems may have any one or more of at least the following characteristics.

In some implementations, at least one of the first circuit element or the second circuit element includes a portion of conductive material.

In some implementations, the portion of conductive material is configured to receive a soldered or bonded connection.

In some implementations, at least one of the first circuit element or the second circuit element includes a connection pad or a bonding pad.

In some implementations, the first circuit element includes an integrated circuit.

In some implementations, the second circuit element includes an input/output (I/O) port.

In another aspect, this disclosure describes another circuit fabrication method. In the method, on a first surface at a first side of a substrate, a location of a connection path within the substrate is located. The connection path includes conductive material that provides an electrical connection among i) a circuit element disposed on a second surface on an opposite, second side of the substrate, ii) a first conductive trace disposed at a first depth in the substrate with respect to the second surface of the substrate, and iii) a second conductive trace disposed at a second depth in the substrate with respect to the second surface of the substrate, the second depth being larger than the first depth. A portion of the conductive material is removed from the connection path by drilling, such that the electrical connection between the first conductive trace and the second conductive trace is severed.

Implementations of this or other methods may have any one or more of at least the following characteristics.

In some implementations, the method includes replacing the removed conductive material with a non-conductive material.

In some implementations, the circuit element is configured to receive a connection to a connector disposed on the second surface, the connector configured to receive one or both of (i) an external cable or (ii) a connection to a circuit board.

In some implementations, the circuit element includes a portion of conductive material configured to receive a soldered or bonded connection.

In another aspect, this disclosure describes another circuit fabrication method. In the method, on a first surface at a first side of a substrate, a location of a connection path within the substrate is located. The connection path includes conductive material that provides an electrical connection among i) a circuit node configured to electrically couple to a circuit element to be disposed on the first surface, ii) a first conductive trace disposed at a first depth in the substrate with respect to the first surface, and iii) a second conductive trace disposed at a second depth in the substrate with respect to the first surface, the second depth being larger than the first depth. A portion of the conductive material is removed from the connection path by drilling, such that the electrical connection between the circuit node and the first conductive trace is severed.

Implementations of this or other methods may have any one or more of at least the following characteristics.

In some implementations, the method includes replacing the removed conductive material with a non-conductive material.

In some implementations, the circuit element includes a portion of conductive material configured to receive a soldered or bonded connection.

In another aspect, this disclosure describes another circuit system. The circuit system includes a circuit board; an integrated circuit mounted on the circuit board, the integrated circuit including a plurality of pins; a trace-to-cable connector mounted on the circuit board, the trace-to-cable connector configured to couple to a first cable of a first cable-type; a cable-to-cable connector mounted on the circuit board, the cable-to-cable connector configured to couple the first cable to a second cable of a second cable-type; and a first plurality of metal traces coupling a first subset of the plurality of pins to the trace-to-cable connector.

Implementations of this or other circuit systems may have any one or more of at least the following characteristics.

In some implementations, the integrated circuit is configured to implement one or more physical layer functions of a network interface controller.

In some implementations, the integrated circuit includes an electro-optical device configured to convert signals received at the integrated circuit into optical signals.

In some implementations, the integrated circuit is configured to amplify a signal received through the trace-to-cable connector.

In some implementations, the first cable-type is Twinaxial.

In some implementations, the cable-to-cable connector includes a Twinaxial-to-small form-factor pluggable (SFP) connector, a Twinaxial-to-quad small form-factor pluggable (QSFP) connector, a Twinaxial-to-octal small form-factor pluggable (OSFP) connector, or a Twinaxial-to-quad small form-factor pluggable-double density (QSFP-DD) connector.

In some implementations, the system includes a Twinaxial cable coupling the trace-to-cable connector to the cable-to-cable connector.

In some implementations, the second cable-type is Ethernet, InfiniBand, Fibre Channel, or PCIe.

In some implementations, the system includes a second trace-to-cable connector mounted on the circuit board, the second trace-to-cable connector configured to couple to the first cable-type; and a second plurality of conductive traces coupling a second subset of the plurality of pins to the second trace-to-cable connector.

In some implementations, the system includes second cable-to-cable connector mounted on the circuit board, the second cable-to-cable connector configured to couple the first cable-type to the second cable-type.

In some implementations, the circuit system includes a second trace-to-cable connector mounted on the circuit board, the second trace-to-cable connector configured to couple to the second cable-type; and a second plurality of conductive traces coupling a second subset of the plurality of pins to the second trace-to-cable connector.

Embodiments of the subject matter described in this specification can be implemented to realize one or more of at least the following advantages. Circuit reconfigurability can be increased. The ability to test separate components within a circuit system can be improved. Circuit compatibility with different external connections can be increased. Transmission loss can be reduced. External I/O port accessibility can be improved. Fabrication processes can be made more adaptable to multiple final circuit configurations The details of one or more implementations are set forth in the accompanying drawings and the description below. Other aspects, features and advantages will be apparent from the description and drawings, and from the claims.

BRIEF DESCRIPTION OF THE DRAWINGS

FIG. 3 shows a layout of example network switching units.

FIGS. 4A-4C show layouts of example network switching units.

FIGS. 5A-5C show layouts of example network switching units.

FIG. 6 shows a layout of an example network switching unit.

FIGS. 7A-7D show a flowchart of example fabrication processes.

FIGS. 9A-9D show layouts of example circuit systems.

FIGS. 13-16B show flowcharts of example fabrication processes.

DETAILED DESCRIPTION

Demand for networking processing continues to increase, driven by the growth of cloud-based services, by the increasing amounts of data available for collection and processing (e.g., data derived from internet-of-things devices), and by the increased interconnectedness of networked devices, among other factors.

Data is generally carried at least partly by electrical signals that, within circuit boards of network devices, are transmitted over conductive traces. However, this transmission is associated with losses as a function of trace material, trace geometry (e.g., length and thickness), and signal frequency, among other possible factors. Increased signal frequencies—for example, signal frequencies dictated by the emergence of new standards—may mean that existing circuit board geometries and configurations exhibit higher than acceptable trace-related losses.

This disclosure describes technologies in which lossy traces are replaced with relatively low-loss cables by connectors integrated into circuit board architectures, such that overall losses are decreased. The circuit board architectures described in this disclosure can also provide increased flexibility and reconfigurability, either for end-users or for circuit board manufacturers. For example, the circuit board architectures may be reconfigured to include secondary circuit boards by coupling the cables internally within network switching devices.

Figure 1:
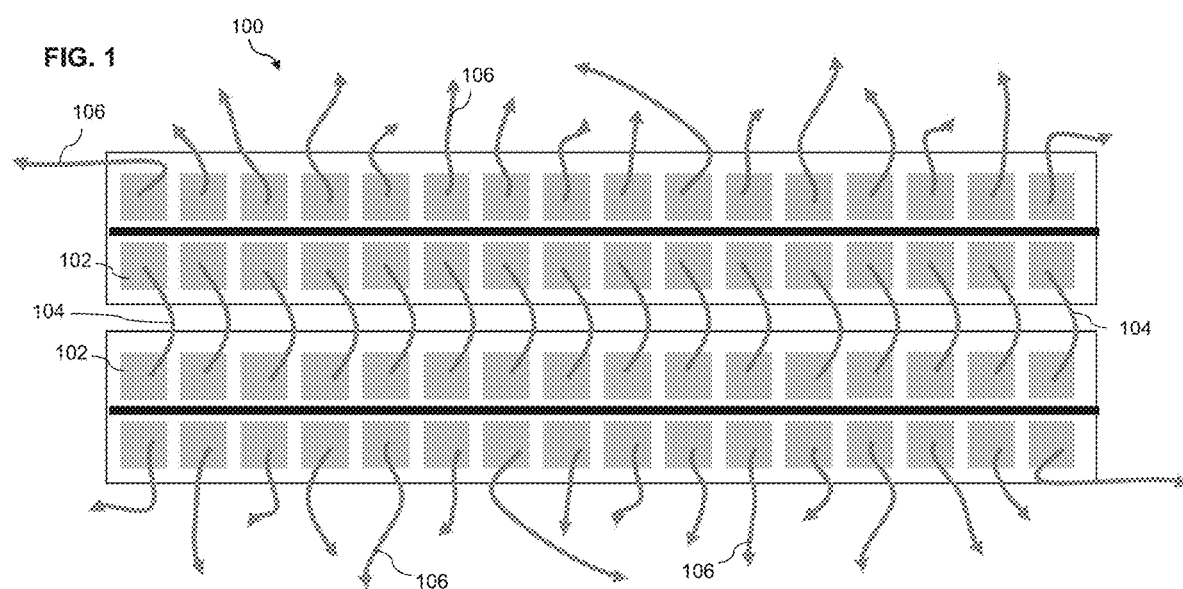
FIG. 1 shows an external front view of an example network switching unit.

As an example environment in which the technology described herein can be implemented, FIG. 1 shows a two rack-unit network switching unit 100 including four rows of sixteen I/O ports (e.g., I/O ports 102) each, for sixty-four total I/O ports 102. The I/O ports 102 may include, for example, small form-factor pluggable (SFP) network interface units, quad small form-factor pluggable (QSFP) units, octal small form-factor pluggable (OSFP) units, and/or quad small form-factor pluggable—double density (QSFP-DD) units compatible with networking standards such as Ethernet, Fibre Channel, and/or InfiniBand. Embodiments of the present disclosure may in general include any cabled I/O connector.

"Network switching units," as described in this disclosure, include at least a wide variety of network-associated devices, including routers, servers, hubs, bridges, gateways, switches, repeaters, and any other computing device that processes high-speed signals. Network switching units can be categorized according to rack-unit sizes (e.g., one rack-unit, two rack-unit, four rack-unit, or another size) based on a size of the network switching unit, a number of connectors on the front of the network switching unit, and other factors. Network switching units according to this disclosure can be of any rack-unit size or any other appropriate height.

As shown in FIG. 1, some cables (e.g., cables 104) are coupled between I/O ports of the network switching unit 100, whereas others (e.g., cables 106) are coupled to other devices not shown in FIG. 1, e.g., servers, routers, interface controllers, and/or other devices. In actual practice, the network switching unit 100 may be just one of many such units included across many racks in a datacenter. The network switching unit 100 can face intense switching and transmission loads, and improvements in networking hardware mean that required performance levels are constantly increasing as networking standards are updated.

Figure 2:
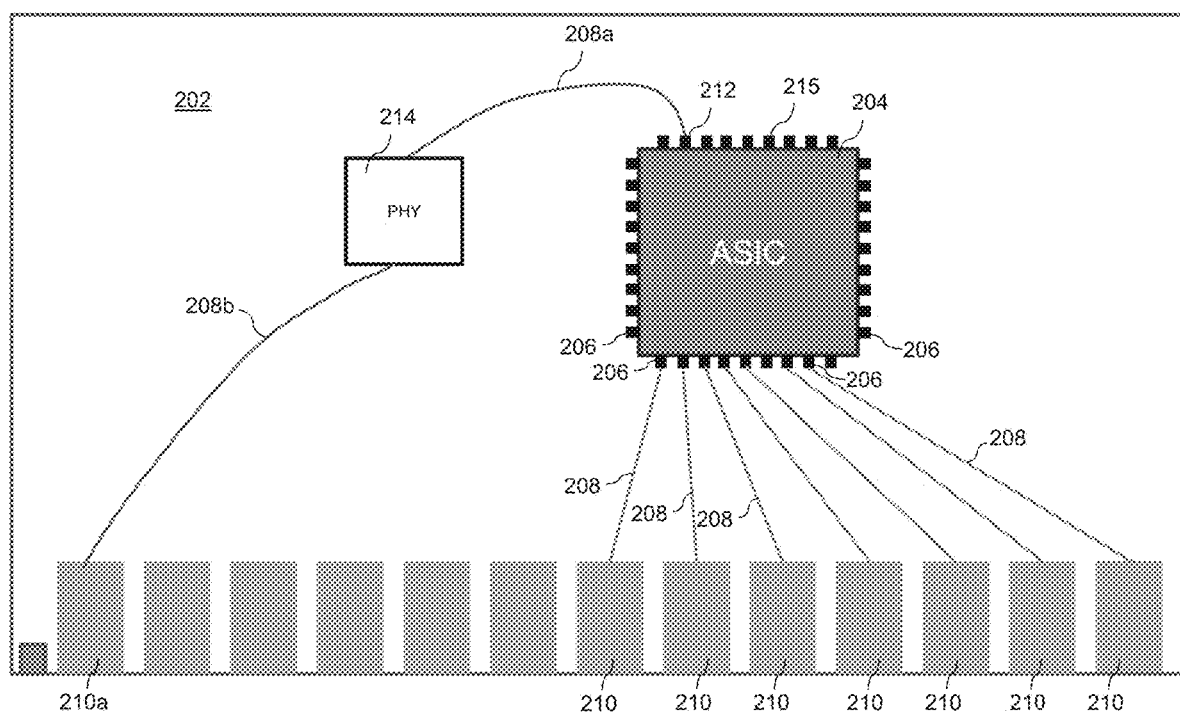
FIG. 2 shows a layout of an example network switching unit.

An example network switching unit 200 is shown in FIG. 2. Internally, the network switching unit 200 includes a first integrated circuit 204 (e.g., an application-specific integrated circuit (ASIC)) mounted on a circuit board 202 (e.g., a printed circuit board (PCB)). The first integrated circuit 204 includes multiple pins (e.g., pins 206), some of which are coupled by conductive traces (e.g., conductive traces 208) to I/O ports 210. A representative selection of such couplings are shown in FIG. 2. Each I/O port 210 may be coupled to, for example, one pin 206, four pins 206, eight pins 206, or a different number of pins. The pins may be on a surface of the circuit board 202, buried in the circuit board 202 (e.g., as vias), or both, and may not all be of the same type.

Pin 212 is coupled by a conductive trace 208a to a second integrated circuit 214 on the circuit board 202. In practice, multiple pins of the first integrated circuit 204 may be coupled to the second integrated circuit 214. The second integrated circuit 214 may be, for example, a physical layer (PHY) or an electro-optical device (OBO). The second integrated circuit 214 is coupled by a conductive trace 208b to I/O port 210a.

The first integrated circuit 204 is configured to perform network switching and/or computational operations of the network switching unit 200. For example, the first integrated circuit 204 may be a general-purpose CPU device, a network switching ASIC, a general-purpose ASIC, an AI accelerator circuit configured to perform training/inference functions, or any other type of processing device.

The second integrated circuit 214 is configured to perform specific operations on signals inbound to and/or outbound from the first integrated circuit 204. For example, in various implementations, the second integrated circuit 214 may perform signal-boosting (e.g., amplification), filtering, retiming, signal diagnosis, signal format conversion, and/or other operations. A PHY implements physical layer operations such as one or more of the aforementioned circuit operations. An OBO converts electrical signals to and from optical signals, and/or uses input optical signals to control operations performed on electrical signals.

The conductive traces 208 are embedded in or on the circuit board 202, e.g., as strips of conductive material (e.g., metal). As described in more detail throughout this disclosure, the conductive traces 208 may span multiple layers of the circuit board 202, e.g., may include vias.

The I/O ports 210 are integrated into an exposed panel of the network switching unit 200 and are configured to couple to one or more other devices, as described in reference to FIG. 1. I/O ports 210 may be configured to couple to two different cable-types on different sides, e.g., a first cable-type for an internal connection of the I/O port 210 and a second cable-type for an external connection of the I/O port.

Performance burdens placed on the network switching unit 200 are often important in the context of current- and next-generation networking standards. For example, the IEEE 802.3ck draft 2.1 standard (Ethernet at transmission speeds of 100 Gbit/s and above) allocates a maximum permissible loss of 6.875 dB per signal path on the host PCB, e.g., on the path from the first integrated circuit 204 to each I/O port 210. Other signal standards include, for example, Fibre Channel, Infiniband, and PCIe signals. Trace routing for a typical 256 lane ASIC to a set of I/O ports requires about 10 inches to 11 inches of trace for the longest traces. For such lengths of conductive trace, the total loss can exceed permissible limits for, for example, 112 Gbit/second data signals. Transmission loss, as referred to in this disclosure, refers to signal attenuation due to transmission through a medium such as a conductive trace, a cable, or other medium. Transmission loss can also be associated with operations of a circuit element that cause attenuation in a signal subject to the operations.

Moreover, physical limitations may render it difficult or impossible to overcome this problem by geometric variation alone. For example, each I/O port can require a certain minimum amount of front-panel space, and cable bend-radii minima can impose additional limitations. Such limitations can prevent realization of smaller form-factor PCBs with shorter trace lengths that may be compatible with the permissible loss limits. The technology described herein can allow for larger form-factor PCBs to be compatible with permissible loss limits, for example, by providing connectors that couple on-board traces of a PCB to low-loss cables—thereby reducing the total length of lossy on-board traces on the PCB to keep the overall loss below the permissible loss limits even for the longest connections.

In some cases, the network switching unit 200 can at least partially overcome the above-described loss problem by making the second integrated circuit 214 a retimer and/or amplifier, which effectively reduces loss on the transmission paths to which it is coupled. The longest conductive traces 208 (e.g., those that would otherwise cause too much loss—for example, a conductive trace from pin 215 to an I/O port) are then routed to the second integrated circuit 214 or to other retimers/amplifiers included in the network switching unit 200.

However, this approach can bring its own drawbacks. For example, conductive traces 208a, 208b "hardwire" the circuit board 202 to the second integrated circuit 214, such that the second integrated circuit 214 cannot be swapped out for other integrated circuits that perform other functions (e.g., for testing purposes or for various different applications). As such, in implementations such as the one shown in FIG. 2, the second integrated circuit 214 is permanently a part of the network switching unit 200.

Another issue introduced by this approach relates to testing and problem diagnosis. Because the second integrated circuit 214 can be deployed for satisfying loss limits, testing of the first integrated circuit 204 is dependent on proper functioning of the second integrated circuit 214. In some such implementations, signal transmission problems may not easily be localized to one integrated circuit or the other.

In addition, during operation, the second integrated circuit 214 consumes power, increasing power consumption of the network switching unit 200 and making cooling of the network switching unit 200 more challenging.

Implementations according to this disclosure use a variety of circuit configurations to remedy some or all of these issues.

FIG. 3 shows a network switching unit 300. As described in reference to FIG. 2, the network switching unit 300 includes a first integrated circuit 304 including multiple pins 306, conductive traces 308, I/O ports 310, and a first circuit board 302 on or in which some or all of the other components are mounted and/or integrated. Unless indicated otherwise, components of the network switching unit 300 operate as described in reference to the network switching unit 200.

In the example shown in FIG. 3, some pins 306 are coupled to the I/O ports 310 by the conductive traces 308. However, this need not be the case in all implementations. For example, in some implementations, each pin 306 is wired as described in reference to pin 312 in this embodiment, e.g., to a connector that can connect to a cable and/or a second circuit board.

Pin 312 is coupled by a conductive trace 308a to a first connector 316. The first connector 316 is configured to connect to one or both of a cable or a second circuit board. In various implementations, four pins, eight pins, or another number of pins may be coupled, by respective conductive traces, to a first connector 316.

The first connector 316 may be an "internal connector," meaning that it is mounted internally in the network switching unit 300 (e.g., mounted on the first circuit board 302) and is configured to couple to one or more components that are also internal to the network switching unit 300. This is different from an external connector, e.g., the I/O ports 310, which are configured to couple to external devices and our located on a panel or otherwise externally-accessible portion of the network switching unit 300.

As described in more detail throughout this disclosure, because the first connector 316 may be coupled, internally within the network switching unit 300, to other components of the network switching unit 300, the circuit board design shown in FIG. 3 can provide a more reconfigurable and flexible system than other systems, e.g., the system shown in FIG. 2 that included only hardwired internal connections. In addition, because the circuit board design shown in FIG. 3 is, in some implementations, compatible with one or more internal cable connections, trace-associated losses can be reduced compared to systems that rely on only conductive traces for signal transmission.

FIG. 4A shows a network switching unit 400 as described in reference to FIG. 3. The network switching unit 400 includes a first integrated circuit 404 including multiple pins 406, conductive traces 408, I/O ports 410, and a first circuit board 402 on or in which some or all of the other components are mounted and/or integrated. Pin 412 is coupled by a conductive trace 408a to a first connector 416. The first connector 416 may be coupled to one or more of the pins 406.

In this implementation, the first connector 416 is a trace-to-cable connector that couples the first connector 416 to a separate cable 418 (e.g., a detachable, swappable cable). The cable 418 may be, for example, a Twinaxial cable, a twisted-pair copper cable, or another cable-type capable of high-frequency signal transmission (e.g., 100 Gbit/s or higher). The cable 418 is coupled to an I/O port 410a that is configured to couple to the cable 418 (e.g., including mating components that match pins of the cable 418), either directly or by an adapter.

In some implementations, the first connector 416 is configured to couple to signal-carrying cables, e.g., Twinaxial cables, as opposed to power-carrying cables.

In some implementations, a cable is integrated together with an internal connector of an I/O port and/or integrated together with another internal connector. For example, in some implementations cable 418 includes the I/O port 410*a* and/or the first connector 416 as part of a preconfigured cable assembly. Such cable assemblies may be included in any of the implementations described in this disclosure in which a cable is coupled to one or more other elements, e.g., the one or more other elements may be integrated together with the cable as a cable assembly.

Notably, in some implementations the cable 418 has a lower loss per unit length than the conductive traces 408. For example, for 112 Gbit/second data signals, loss per unit length in the cable 418 may be less than one-third, less than one-fifth, or less than one-tenth the loss per unit length of the conductive traces 408 depending on the construction of the cable.

Because of this lower loss, the transmission path from pin 412 to the I/O port 410*a* (e.g., through conductive trace 408*a*, the first connector 416, and the cable 418) exhibits less loss than would an equivalent transmission path that went through a conductive trace without a cabled component, e.g., a conductive trace directly from pin 412 to the I/O port 410*a*. Therefore, the circuit configuration shown in FIG. 4A may satisfy high-speed loss requirements that an entirely trace-coupled circuit would not satisfy.

For example, for network communication signals with a transmission rate of at least 112 Gbit/second, transmission losses at the rate of 112 Gbit/second from the pins 406 to the I/O ports 410, along the conductive traces 408, may be less than about 6.875 dB. In some implementations, the transmission losses may be less than about 4.875 dB.

In addition, transmission losses at the rate of 112 Gbit/second from pin 412, through conductive trace 408*a*, through the first connector 416, through cable 418, and to I/O port 410*a* may also be less than about 6.875 dB or less than about 4.875 dB.

The first connector 416 can also be used to connect the first integrated circuit 404 to a second integrated circuit on a second circuit board, as shown in the example configuration of FIG. 4B.

The network switching unit 422 shown in FIG. 4B includes a second circuit board 424 on which is mounted a second integrated circuit 426. The second integrated circuit 426 includes pins (e.g., pins 428) that are coupled, by conductive traces 430 in and/or on the second circuit board 424, to a second connector 432, a third connector 434. The pins may also be connected to optional auxiliary connector(s) 436 by conductive traces 448, which may be the same trace type as, or a different trace type from, the conductive traces 430. In some implementations, the second integrated circuit 426 is mounted on a socket in the second circuit board 424, the socket allowing for easy replacement/swapping of the second integrated circuit 426 and other devices.

The auxiliary connectors 436 implement low-speed couplings to the second integrated circuit 426. For example, the auxiliary connectors can include power connections from the first circuit board 402 and/or from another source. These auxiliary connections may be made, for example, by cables coupled to components (not shown) mounted on the first circuit board 402. In some implementations, the auxiliary connectors may be exempt from the speed/loss requirements of the network switching unit 422. Any cables coupled to the auxiliary connectors may be of a different cable-type than any or all of the other cables described herein, e.g., of a different type from signal-carrying Twinaxial cables. The cables coupled to the auxiliary connectors may include, for example, power cables and/or low-speed signal cables. Auxiliary connections may also be via other connector types, e.g., mezzanine connectors.

In the example of FIG. 4B, the first connector 416 is coupled to the second connector 432 by a first cable 438, and the third connector 434 is coupled to the I/O port 410*a* by a second cable 439. Each of these cables 438, 439 may be of a cable-type as described for cable 418, e.g., a cable capable of high-speed, low-loss transmission. In some implementations, the second connector 432 and third connector 434 are trace-to-cable connectors. The connectors 432, 434 are configured for compatibility with the first connector 416 and the I/O port 410*a*, e.g., the second connector 432 is configured to connect to the same cable-type as is the first connector 416, and the third connector 434 is configured to connect to the same cable-type as is the I/O port 410*a*. In some implementations, connectors 416, 432, 434 and I/O port 410*a* are all configured to couple to the same cable-type, such that, for example, the first cable 438 and the second cable 439 can be the same cable-type and a high degree of cable interchangeability is achieved.

As noted for cable 418, and as is also the case for other cables described in this disclosure, in some implementations cable 439 is integrated together with I/O port 410*a* as a cable assembly. Similarly, cable 438 may be integrated together with connectors 416 and/or 432 as a cable assembly.

The second circuit board 424 may be mounted on the first circuit board 402 using one or more mechanical mounting connectors located at appropriate locations on the first circuit board 402. This can allow for easier cooling of devices on the first and second circuit boards 402, 424, by situating devices on the respective boards at a different heights.

In some implementations, the second circuit board 424 is situated outside of an enclosure of the network switching unit 422 for easier access, e.g., for interoperability testing with several different second integrated circuits 426, e.g., from different vendors. Implementations of the second circuit board 424 can be included in routing devices, server devices, and/or any other network-associated device to be flexibly connected to a network switching unit.

The second integrated circuit 426 may be, for example, a PHY, and may perform any or all of the functions described for the second integrated circuit 214. However, compared to the example network switching unit 200, the network switching unit 422 can provide certain advantages. For example, because of the first connector 416, the second circuit board 424 can be swapped in/out at will. The second circuit board 424 can be replaced with a cabled connection to provide a connection that satisfies loss requirements without necessitating a retimer and/or amplifier, or another circuit board can replace the second circuit board 424 for testing purposes or to provide different functionality, as described, for example, in reference to FIG. 4C.

In some implementations, the presence of one or both cables 438, 439 along a portion of the transmission path (as opposed to a trace-only transmission path from pin 412 to I/O port 410*a*) is sufficient to cause the connection to satisfy loss limits, because the cables 438, 439 have lower loss per unit length than conductive traces.

FIG. 4C shows a network switching unit 440. The network switching unit 440 is a different configuration of the network switching units 400, 422, and the components of the network switching unit 440 operate as described for those devices except where described otherwise. As described for FIG. 4B, the network switching unit 440 may be obtained from either of the network switching units 400, 422 by appropriate swapping of replaceable components.

The network switching unit 440 includes a third circuit board 442 on which is mounted an electro-optical device 441 that can convert signals back and forth from the electrical to optical domain. The electro-optical device 441 includes pins 446 that are coupled, by conductive traces 430 in and/or on the third circuit board 442, to a fourth connector 450. The pins 446 may also be connected by conductive traces 448 in and/or on the third circuit board 442, to optional auxiliary connector(s) 452. The fourth connector 450 and optional auxiliary connectors 452 may be configured as described for the second connector 432 and auxiliary connectors 436 shown in FIG. 4B. In some implementations, the electro-optical device 441 is mounted on a socket in the third circuit board 442, the socket allowing for easy replacement/swapping of the electro-optical device 411 and other devices.

The electro-optical device 441 also includes an optical connector 454 configured to connect to an optical fiber 456. For example, the electro-optical device 441 may be configured to receive electrical signals from the first integrated circuit 404 and convert them into optical signals that are sent to an external device, receive optical signals from an external device and convert them into electrical signals that are sent to the first integrated circuit 404, or both.

The optical fiber 456 is coupled to an optical port 458 of the network switching unit 440. The optical port 458 is configured to couple to external devices, e.g., is integrated into the same exposed panel of the network switching unit 440 into which the I/O ports 410, 410a are integrated.

The implementations shown in FIGS. 4A-4C can provide certain advantages compared to devices in which a PHY or OBO is hardwired onto the first circuit board 402, e.g., coupled to the first circuit board 402 by only conductive traces. For example, the second circuit board 424 may be swapped with a third circuit board 442, or other circuit boards, depending on particular applications and/or desired signal processing functionality. If signal transmission failures are detected, the cause for the failure may be localized efficiently, to either the swappable circuit board or the first integrated circuit 404. And, in some implementations, a user can take advantage of the trace-to-cable connector 416 to directly couple to the I/O port 410 by the cable 418.

The implementations shown in FIGS. 4B-4C flow from the circuit topology shown in FIGS. 3 and 4A, e.g., the inclusion of the first connector 416, in this example a trace-to-cable connector, that is coupled to the first integrated circuit 404 by a conductive trace 408a.

Figure 5A:
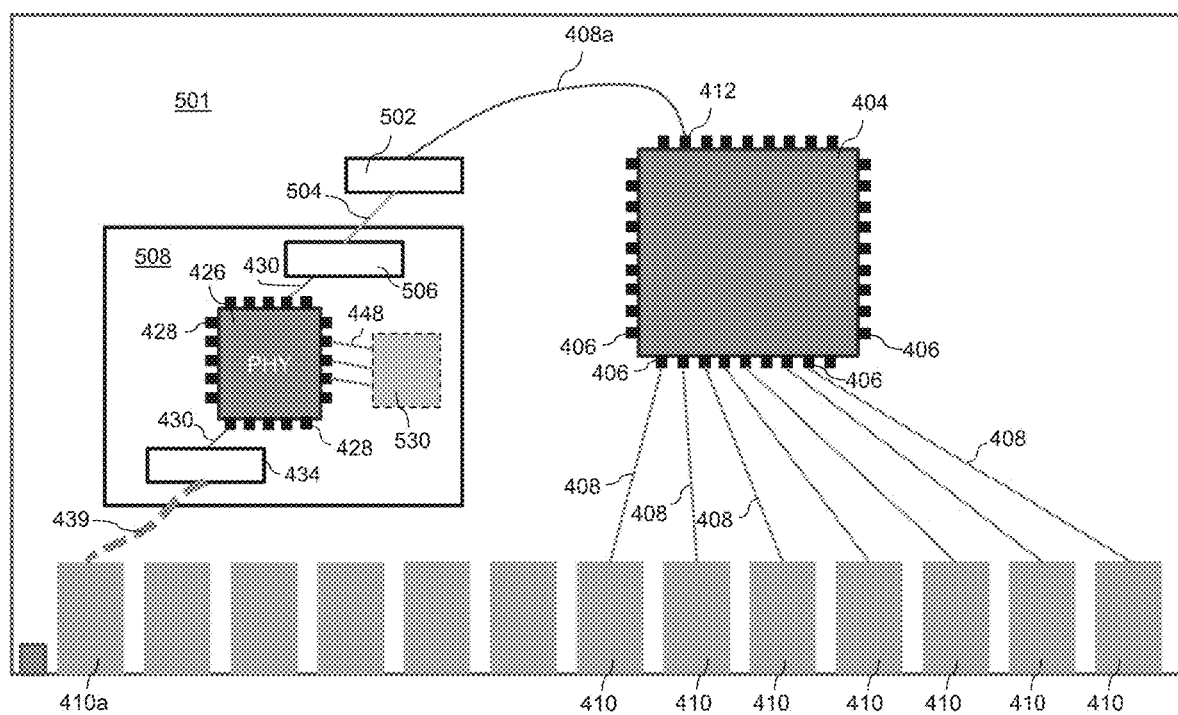

FIG. 5A shows a network switching unit 500 as described in reference to FIG. 3. Unless indicated otherwise, the components of network switching unit 500, including components on the second circuit board 508, may operate as described for the network switching unit 422 shown in FIG. 4B. The circuit architecture of network switching unit 500 may provide some or all of the advantages described for the network switching unit 422.

In this implementation, a first connector 502 on a first circuit board 501 is at least a trace-to-board connector. The first connector 502 is configured to removably couple to another circuit board (e.g., to a corresponding connector of another circuit board) in a mating configuration. For example, the first connector 502 may be a first mating half of a mezzanine connector.

A second connector 506 is mounted on a second circuit board 508. In some implementations, the second connector 506 is a trace-to-board connector, e.g., is designed to mate, by an inter-board connection 504, with the first connector 502. The second connector 506 may be a second mating half of a mezzanine connector. The inter-board connection 504 can represent, for example, one or more electrical paths between the first connector 502 and the second connector 506, the one or more electrical paths being coupled when the first and second connectors 502, 506 are mated. The inter-board connection 504 need not be a separate component—rather, in some implementations, the inter-board connection 504 can represent an electrical coupling between the connectors 502, 506.

In some implementations, auxiliary connectors 530 mounted on the second circuit board 508 are integrated into the second connector 506, such that low-speed signals (e.g., power) are transmitted through the mated first connector 502 in addition to high-speed signals.

As described in reference to FIG. 4B, in some implementations, the second integrated circuit 426 (e.g., PHY) of the network switching unit 500 may perform signal-boosting (e.g., amplification), filtering, retiming, signal diagnosis, signal format conversion, and/or other operations, either to provide inputs to the first integrated circuit 404, to operate on outputs of the first integrated circuit 404, or both.

FIG. 5B shows an example network switching unit 540. Two trace-to-board connectors 502, 506 on, respectively, a first circuit board 501 and a third circuit board 510, allow the circuit boards 501, 510 to be removably coupled together with or without the use of an inter-board connection 504.

Unless indicated otherwise, the components of network switching unit 540, including components on the third circuit board 510, may operate as described for the network switching unit 440 shown in FIG. 4C and the network switching unit 500 shown in FIG. 5A, as indicated by matching element labels. The circuit architecture of network switching unit 540 may provide some or all of the advantages described for the network switching units 440 and 500.

As described in reference to FIG. 4C, in some implementations, the OBO 441 of the network switching unit 540 may implement optical operations, e.g., electrical-to-optical signal conversion. An optical connector 454 is configured to connect to an optical fiber 456 that is coupled to an optical port 458 of the network switching unit 540. The optical port 458 is configured to couple to external devices, e.g., is integrated into the same exposed panel of the network switching unit 540 into which the I/O ports 410 are integrated.

The implementations shown in FIGS. 5A-5B can provide advantages compared to devices in which a PHY or OBO is hardwired onto the first circuit board 501, e.g., coupled to the first circuit board 501 by only conductive traces. The second circuit board 508 may be swapped for the third circuit board 510, or other circuit boards, depending desired signal processing or other functionality, as described in reference to FIGS. 4B-4C. In some implementations, the inclusion of a cabled coupling (e.g., by the connector 434 of the network switching unit 500) can reduce transmission loss compared to trace-only configurations. Moreover, the trace-to-board connector 502 can make the swapping of different circuits boards in and out of place fast and convenient, as compared to some devices in which all connections between different circuit boards are made by cables.

Figure 5C:
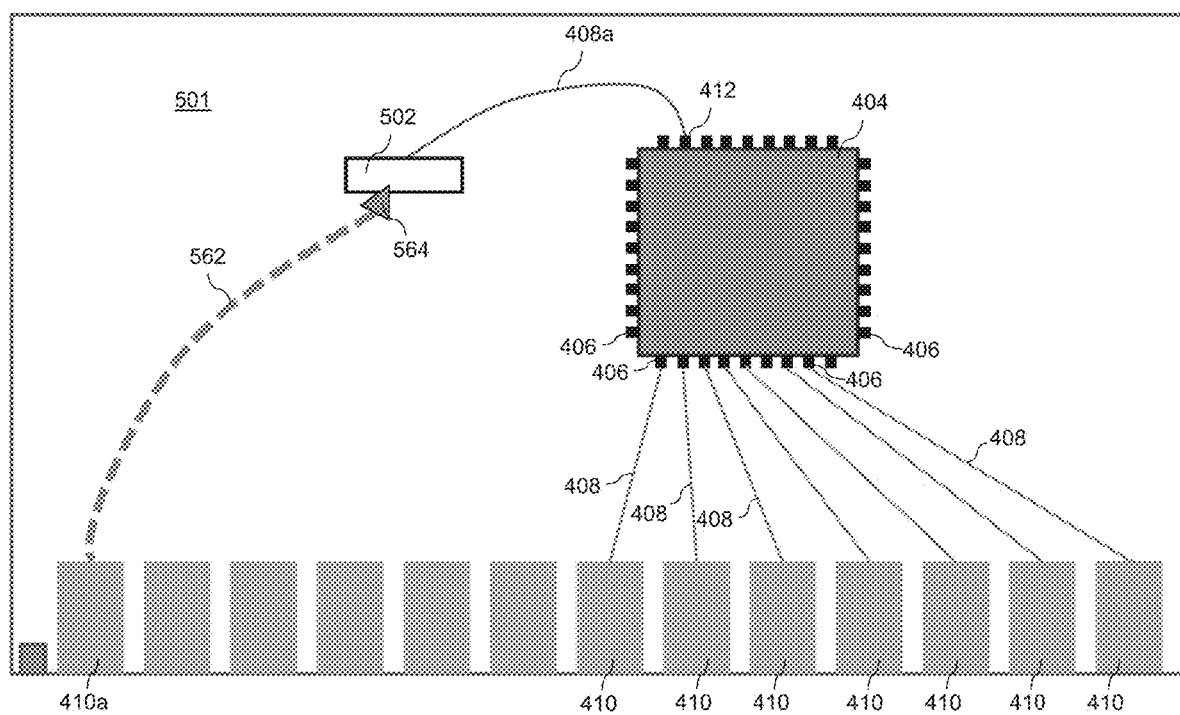

The implementations shown in FIGS. 5A-5C flow from the circuit topology shown in FIG. 3, e.g., the inclusion of the first connector 502, in this case a trace-to-board connector, that is coupled to the first integrated circuit 404 by a conductive trace 408a.

In some implementations, the network switching unit shown (in different configurations) in FIGS. 5A-5B can be configured using cabled connections, without the inclusion of a second circuit board. As shown in FIG. 5C, a network switching unit 560 includes components as described for FIGS. 5A-5B. In addition, a cable 562 is coupled to the first connector 502, in some implementations by an adapter 564 configured to accommodate the coupling. For example, the adapter 564 includes, on one side, mating components configured to mate with the cable 562 (e.g., pins configured to connect to a Twinaxial cable), and, on another side, mating components configured to mate with the trace-to-board connector 502. In some implementations, the cable 562 is connectable to the first connector 502 without an adapter.

The cable 562 may be a cable as described for cable 418 in reference to FIG. 4A and/or as described for cable 439 in FIG. 4B, e.g., a Twinaxial cable, a twisted-pair copper cable, or another cable-type capable of high-frequency signal transmission Because of the comparatively low loss per unit length of the cable 562 compared to conductive traces, in some implementations, the connection between pin 512 and I/O port 410a satisfies loss requirements, even without a retiming and/or amplifying integrated circuit coupled between the pin 412 and the I/O port 410a.

Therefore, using the adapter 564, cable-only configurations can be formed even without a dedicated trace-to-cable connector as shown in FIGS. 3A-3C.

However, in general, trace-to-cable implementations (FIGS. 4A-4C) need not be distinct from trace-to-board implementations (FIGS. 5A-5C). For example, in some implementations, the first connector (e.g., the first connector 316) is a dual-function connector capable of coupling to a cable and to a second circuit board, without requiring a separate adapter. For example, the first connector may include two sets of connecting pins that are arranged, respectively, to couple to the two different geometries of i) a cable end and ii) a mezzanine connection or other trace-to-board connection.

Figure 5D:
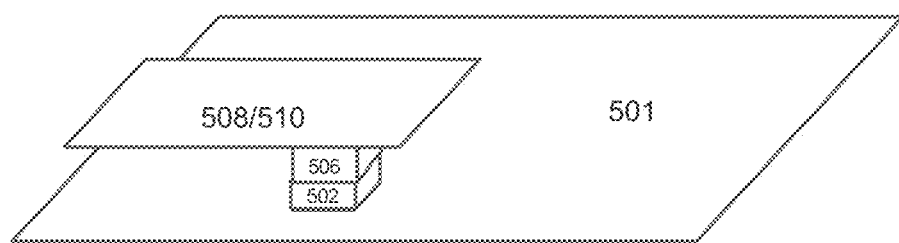
FIG. 5D shows a perspective view of an example network switching unit.

FIG. 5D shows an example implementation of two circuit boards coupled by trace-to-board connections. In this example, the first connector 502 and the second connector 506 are placed on top of one another to connect circuit boards 501 and 508/510. Examples of appropriate board-board connectors can include, for example, MegArray connectors, Novaray connectors, and Impel connectors.

As noted above, loss issues may arise because of long connection lengths between a first integrated circuit and I/O ports of a network switching unit. For a set of pins included in the first integrated circuit, a first subset of the pins are close enough to the I/O ports that conductive trace connections between the first subset of pins and the I/O ports satisfy loss requirements. For the first subset of pins, retimers, amplifiers, and/or cables are not necessary between the pins and the I/O ports (though trace-to-cable and/or trace-to-board connectors may still be coupled to the first subset of pins by conductive traces, to provide the flexibility and reconfigurability advantages noted throughout this disclosure).

For a second subset of pins, distances between the pins and the I/O ports are such that direct conductive traces would exhibit larger than allowable loss. For the second subset of pins, retimers, amplifiers, and/or swappable connectors (e.g., trace-to-cable and/or trace-to-board connectors) may be included to reduce the loss, as described throughout this disclosure.

Network switching units as described throughout this disclosure (e.g., network switching units described in reference to FIGS. 3-5D) may be configured to meet particular transmission loss criteria. For example, a fully trace-coupled connection between a first circuit element and a second circuit element in a first circuit board design may be analyzed to determine that transmission losses through the trace of the connection exceed a loss threshold such as the 6.875 dB maximum loss standard for 100 Gbit/s second signals. The fully trace-coupled connection may be, for example, a fully trace-coupled connection between an integrated circuit and an I/O port, such as the connections provided by the conductive traces 308 of FIG. 3. For example, the first circuit board design can be fabricated and tested, or can be modeled (e.g., by simulating on a software application).

In response to the determination that the loss threshold will be exceeded in the fully trace-coupled connection, the first circuit board design can be altered to produce a second circuit board design in which the trace is routed from the first circuit element to a trace-to-cable connector and/or trace-to-board connector. The trace-to-cable connector supports a cabled connection to the second circuit element, the cable having a lower loss per-unit-length than the conductive trace. Over the full circuit path from the first circuit element to the second circuit element, the total transmission loss is less than the loss threshold. For example, FIG. 4A is an example of a second circuit board design in which the first circuit element is the first integrated circuit 404 and the second circuit element is the I/O port 410a. Although an entirely trace-coupled connection from the first integrated circuit 404 to the I/O port 410a may have a transmission loss above a threshold loss, transmission losses from the integrated circuit 404, through conductive trace 408a, through the first connector 416, and through cable 418 may have a transmission loss under the threshold loss.

In some implementations, FIG. 5A is another example of a second circuit board design. Although an entirely trace-coupled connection from the first integrated circuit 404 to the I/O port 410a may have a transmission loss above the threshold loss, the first connector 502 supports a trace-to-board connection to a second circuit board 508 that that can, in some implementations, perform amplification, retiming, and/or another operation that has the effect of reducing transmission loss for signals transmitted through the conductive trace 408a into the second circuit board 508. The second circuit board 508 also supports a cabled connection through the second cable 439 to the I/O port 410a. In the second circuit board design, the operation of the second circuit board 508, the replacement of at least some trace coupling with the cabled coupling of the second cable 439, or both of these factors, cause transmission losses from the integrated circuit 404, through conductive trace 408a, through the first connector 502, through the second circuit board 508, and through the second cable 439 to be under the threshold loss.

In some implementations, an altered circuit board design may include an additional circuit element that has the effect of increasing, rather than decreasing, transmission losses. For example, an integrated circuit electrically coupled between the first circuit element and second circuit element may operate on incoming signals with the effect of increasing attenuation of the incoming signals. In such a case, total transmission losses in the altered circuit board design may still be below the threshold loss value. In some implementations, FIG. 4B is an example of such an altered circuit board design. The second circuit board 424, by operation of the second integrated circuit 426, may contribute net transmission loss. For example, the second circuit board 424 may modify the signal format or encrypt the signal, either of which can contribute transmission loss. However, because either or both of cables 438 and 439 have lower loss per unit length than the conductive trace 408, total transmission losses from the first integrated circuit 404 to the I/O port 410a may still be below the threshold loss value. As noted previously, in some implementations the second circuit board 424 serves to reduce transmission loss, e.g., by boosting the signal or performing a retiming function.

One or more aspects of an altered circuit board design may provide reduced transmission loss. In some implementations, the connector included in the altered circuit board design is closer to a signal source (e.g., the first circuit element such as an integrated circuit) than to a signal receiver (e.g., the second circuit element such as an I/O port). This can increase a proportion of the signal transmission path composed of cable instead of conductive trace.

In some implementations, the connector is located to provide a given transmission loss budget, e.g., located such that transmission losses between the first circuit element and the connector along the trace are less than a second threshold transmission loss. A difference between the overall threshold transmission loss and the second threshold transmission loss represents the available transmission loss budget that is available for one or more other components on a signal path between the connector and the second circuit element. The one or more other components may be connectable to the connector by a cable.

Because network transmission losses in network switching units can be reduced as described herein, loss budget can be made available for other components of the overall network system. For example, external connections made via I/O ports (e.g., I/O port 410a) can reach longer distances, e.g., by longer cables. This can be especially useful in rack-level deployments of servers and switches, in which space for system components is at a premium and longer connection distances can provide considerable configuration flexibility.

Loss may instead, or additionally, be reduced by a modified geometry of the circuit board. As shown in FIG. 6, a network switching unit 600 includes a first circuit board 602. The first circuit board 602 includes several distinct edges 607a, 607b, 607c, 607d, 607e. A first integrated circuit 604 is disposed on or in the first circuit board 602 and includes a plurality of pins coupled to conductive traces (e.g., conductive traces 608). I/O ports 610 are distributed across each of the edges 607a, 607b, 607c, 607d, 607e, arranged to receive connections to external devices. This can be referred to as a "staged" design of the circuit board 602.

Each of the edges 607a, 607b, 607c, 607d, 607e may be straight, curved, or both. The edges 607a, 607b, 607c, 607d, 607e may be parallel to one another (as shown in the example of FIG. 6) or may be non-parallel to one another, e.g., angled with respect to one another. In addition, although FIG. 6 shows the edges 607a, 607b, 607c, 607d, 607e as disposed along one side 605 of the first circuit board 602, in some implementations the edges may be disposed along two or more sides of a circuit board.

As shown in FIG. 6 (which shows only a representative portion of connections), a first subset of pins 606a is coupled by conductive traces to I/O ports 610 on edge 607a; a second subset of pins 606b is coupled by conductive traces to I/O ports 610 on edge 607b; a third subset of pins 606c is coupled by conductive traces to I/O ports 610 on edge 607c; and a fourth subset of pins 606d is coupled by conductive traces to I/O ports 610 on edge 607d. The arrangement of connections is configured to keep lengths of each conductive trace below a maximum value above which loss through the conductive trace would exceed a desired limit. For example, if the fourth subset of pins 606d were coupled, by conductive traces, to I/O ports on edges 607a or 607b, lengths of the conductive traces would be too long, and loss for high-speed signals in the conductive traces would be unacceptably high.

In some implementations, routing and board layout considerations may mean that not all edges can simply be provided very close to the first integrated circuit 604 in order to reduce conductive trace length. For example, if all I/O ports were disposed on an edge formed along the hypothetical line 609 shown in FIG. 6, then the first circuit board 602, in some cases, might not include space for necessary components between the first integrated circuit 604 and the I/O ports, or there might not be enough space to route conductive traces from all of the pins 606 to the I/O ports.

Besides the improvements in reduced loss, devices including I/O ports disposed along multiple edges can provide usability advantages. For example, because the I/O ports 610 are disposed along different edges of a front panel of the network switching unit 600, external cables attached to the I/O ports 610 (not shown) can be connected with increased bend radius and/or with increased user accessibility, compared to if the I/O ports were disposed along one edge.

The network switching unit 600 also includes a first connector 614 coupled to a pin 603 by a conductive trace 608. The first connector 614 may be a trace-to-cable connector, a trace-to-board connector, or both, in various implementations. Here, the network switching unit may or may not include a cable housing 611 attached between I/O port 610a (disposed on edge 607e) and the first connector 614.. The cable housing 611 can allow for better cable management by, for example, holding one or more cables in place, thereby allowing for improved control of air flow and cooling in the network switching unit..

This disclosure describes circuit systems that are flexible and reconfigurable because of their connectors and coupling arrangements. However, flexibility can also be important during circuit system manufacturing processes. For example, consider the network switching unit 400 shown in FIG. 4A. In certain circumstances (e.g., when increased loss may be tolerated, when data speeds are lower, or when the introduction of novel materials may reduce a conductive trace's loss per unit length), it may be acceptable to couple pin 312 to I/O port 310a directly by a conductive trace, e.g., without an intervening connector, cable, retimer, or amplifier.

To account for those cases, it may be useful to provide partly-manufactured circuit systems that can be modified, by alternative fabrication steps, into alternative finished circuit systems. For example, an unfinished circuit system that received a first set of processing steps would result in the network switching device shown in FIG. 3, including a first connector 614. The same unfinished circuit system, subjected to a second, different set of processing steps, would result in an alternative device, e.g., a device in which pin 312 is coupled to I/O port 310a directly by a conductive trace. This method of fabrication can reduce costs and increase the flexibility of fabrication processes, e.g., because the precise form of the finished device need not be determined during earlier portions of the fabrication process.

Figure 7A:
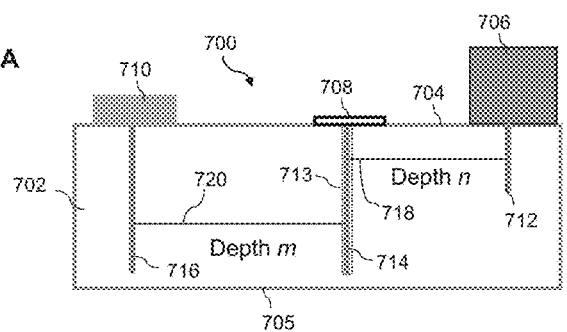

FIG. 7A shows a circuit system 700 with reconfigurable underlying couplings. The circuit system 700 includes a substrate 702 (e.g., a PCB, a semiconductor substrate, a glass substrate, etc.) having a first surface 704. A first circuit element 706, a second circuit element 708, and a third circuit element 710 are each disposed at least partially on the first surface 704. Each of the first, second, and third circuit elements 706, 708, 710 may include, for example, at least one of one or more connectors, one or more pins, one or more I/O ports, one or more connection pads, one or more bonding pads, one or more ends of one or more vias exposed at a surface, one or more portions of conductive material (e.g., a portion of conductive material that is part of a via), one or more elements configured to electrically couple to another element (e.g., one or more pins, ports, or stubs), one or more integrated circuits, one or more power rails, one or more ground connections, or any other one or more circuit elements that can send, receive, transmit, and/or carry electrical signals.

For clarity, FIG. 7A shows the circuit system 700 with the circuit elements 706, 708, 710 in position, mounted on the substrate 702. However, in some implementations, the circuit reconfiguration (e.g., drilling) described below is performed before the mounting of some or all of the circuit elements 706, 708, 710. For example, a circuit board, including vias and conductive traces, may be fabricated without mounting of some or all circuit elements and without reconfiguring the circuit board to conform to a final circuit configuration. When the final circuit configuration becomes known, circuit reconfiguration (e.g., drilling) is performed to set the final circuit configuration, and any unmounted circuit elements are mounted. This process may avoid difficulties associated with drilling into circuit boards while components are mounted, potentially damaging the components, and/or difficulties associated with drilling through components to set the final circuit configuration. This can also allow different types of the circuit elements to be selected based on the drilling-based reconfiguration of the circuit system.

In some implementations, some or all circuit elements may be added part of the way through drilling-based reconfiguration.

Moreover, in some implementations, one or more of the circuit elements 706, 708, 710 are not separate, mounted components but, rather, are integrated into other elements of the circuit system 700. For example, a circuit element may be a portion of conductive material included in a via, e.g., a portion of the via exposed at the first surface 704 and configured to receive a connection to another circuit element mounted on the exposed portion of the via. The circuit element may represent a circuit node configured to receive the connection to the other circuit element, e.g, another circuit element mounted on the exposed portion of the via.

A first via 712 is coupled to the first circuit element 706, a second via 714 is coupled to the second circuit element 708, and a third via 716 is coupled to the third circuit element 710. Each via 712, 714, 716 extends from the first surface 704 and extends substantially perpendicularly to the first surface 704 so as to couple to the circuit elements 706, 708, 710. The vias 712, 714, 716 include columns of conductive material (e.g., metal) that extend through multiple depths in the substrate 702 (e.g., across multiple layers of a PCB) in order to connect components disposed at the different depths. The vias 712, 714, 716 may be formed by, for example, drilling respective holes in the substrate 702 and electroplating the conductive material inside the holes. Other via fabrication methods may instead or alternatively be used, e.g., layer-by-layer drilling during PCB stacking. The individual traces and vias shown in FIG. 7A represent the multiple vias and multiple traces that may connect two circuit elements, e.g., the multiple traces and/or vias coupling respective multiple pins of two circuit elements.

A first conductive trace 718, disposed at a first depth n in the substrate 702 with respect to the first surface 704, couples the first via 712 to the second via 714. A second conductive trace 720, disposed at a second depth m in the substrate 702, couples the second via 714 to the third via 716. Depth m is larger than depth n. In some implementations, depth n is zero, e.g., the first conductive trace 718 is disposed on the first surface 704. In some implementations, depth m equals a thickness of the substrate 702, such that the second conductive trace 720 is disposed on a second surface 705 opposite the first surface 704. Either or both of the conductive traces 718, 720 may be buried within the substrate 702.

Based on these connections, the first, second, and third circuit elements 706, 708, and 710 (when included in the circuit system 700) are coupled to one another, which may provide useful circuit functionality. However, the circuit system 700 is also reconfigurable into multiple final circuit configurations based on one or more additional fabrication steps performed on the circuit system 700, which, as noted above, may be performed before inclusion of the circuit elements 706, 708, 810. Examples of such reconfigurations into final circuit configurations are shown in FIGS. 7B-7D.

Figure 7B:
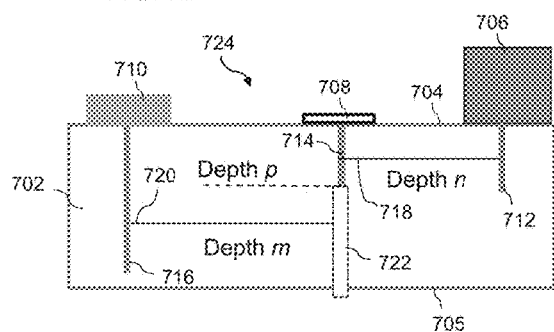

As shown in FIG. 7B, a shaft 722 is drilled from the second surface 705 and to a depth p with respect to the first surface 704, the depth p being larger than depth n and less than depth m. The shaft 722 is aligned with the second via 714. The drilling of the shaft 722 removes conductive material from the second via 714 in the depths through which the shaft 722 is drilled, including at the depth m, such that, subsequent to drilling, the second conductive trace 720 is no longer coupled to the second via 714. However, the coupling between the second via 714 and the first conductive trace 718 is left intact. Therefore, as a result of the drilling, in the circuit system 724 shown in FIG. 7B, the first circuit element 706 and the second circuit element 708, when included in the circuit system 724, are coupled, while circuit elements 706, 708 are decoupled from the third circuit element 710.

Figure 7C:
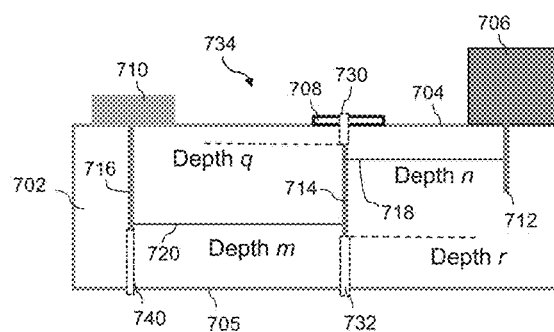

FIG. 7C shows an alternative fabrication process performed on the circuit system 700. A first shaft 730 is drilled from the first surface 704 to a depth q that is less than depth n. A second shaft 732 is drilled from the second surface 705 to a depth r that is larger than depth m. Both shafts 730, 732 are aligned with the second via 714, such that conductive material of the second via 714 is removed along the depths through which the shafts 730, 732 extend.

If the first shaft 730 is drilled before the second circuit element 708 is mounted on the substrate 702, the first shaft 730 removes material of the second via 714 and, in some implementations, non-conductive material of the substrate 702. In some implementations, the first shaft 730 is drilled when the second circuit element 708 is already in place, in which case the first shaft 730 may additionally be drilled through the second circuit element 708.

As a result of the drilling and the removal of the conductive material of the second via 714, in the circuit system 734 shown in FIG. 7C, the coupling between the second circuit element 708 and the other circuit elements 706, 710 is severed when the circuit elements 706, 708, 710 are included in the circuit system 734. However, the first circuit element 706 and the third circuit element 710 are coupled through the first via 712, the first conductive trace 718, the second via 714, the second conductive trace 720, and the third via 716.

The drilling of the second shaft 732 is optional and may depend on an extent to which the second via 714 extends past the second conductive trace 720 prior to drilling, and may instead or additionally depend on an extent to which the circuit system 700 is able to tolerate stubs.

In some implementations, for the final circuit configuration 734 of FIG. 7C, the second circuit element 708 may not be included (e.g., may not be mounted after drilling-based circuit reconfiguration), being superfluous due to the direct electrical coupling between the first and third circuit elements 706, 710.

Drilling may additionally be performed to remove portions of other vias, e.g., for reasons besides circuit reconfiguration. In some implementations, some or all of the vias initially extend through an entire depth of the substrate 702, or extend longer than necessary in the substrate 702, and they are subsequently drilled to set their final length. For example, a stub portion 740 of the third via 716 may be removed to improve circuit characteristics of the circuit system 734. This and other drilling operations performed for reasons besides circuit reconfiguration can be performed at the same time as circuit reconfiguration (e.g., as part of a series of drilling steps performed in sequence, the series of drilling steps including drilling of a via to reconfigure the circuit system), or may be performed in advance, before the final circuit configuration is known.

In a PCB context (e.g., when the substrate 702 includes a PCB), the "depths" referenced in this disclosure may equally refer to discrete layers of the PCB. In some implementations, shafts are drilled to adjacent layers to those disclosed herein, in order to minimize stub length. For example, layer p may be layer n+1; layer q may be layer n−1; and layer r may be layer m+1. In some implementations, to accommodate intermediate drilling depths, layer m is at least two layers below layer n, that is, m may be larger than or equal to n+2 in a PCB context. However, other configurations are also within the scope of this disclosure. For example, in various implementations, necessary layer offsets (if present) can depend on the layer thicknesses and manufacturing tolerances of the PCB manufacturer, and other factors.

Figure 11:
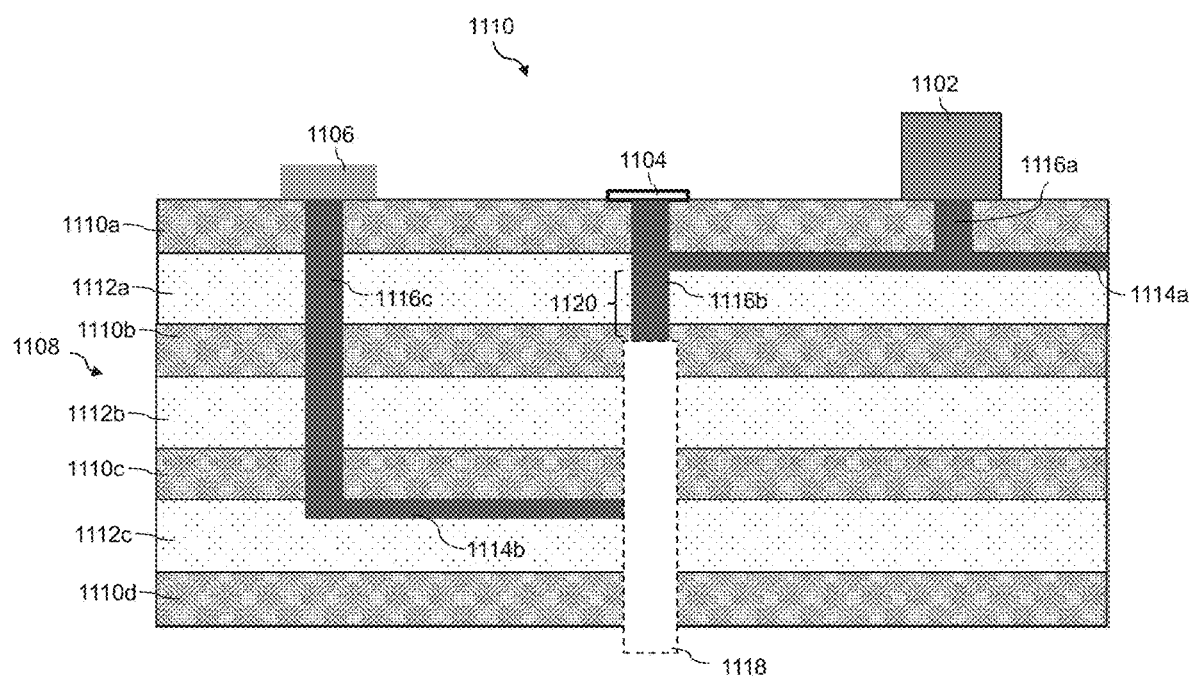
FIG. 11 shows a cross-sectional diagram of an example circuit system.

FIG. 11 shows a schematic diagram of an example of a circuit system 1100 after reconfiguration drilling and mounting of circuit elements 1102, 1104, 1106 onto a PCB 1108. The PCB 1108 includes alternating layers of core layers 1110a, 1110b, 1110c, 1110d and pre-preg layers 1112a, 1112b, 1112c. The pre-preg layers 1112a, 1112b, 1112c are bonded fiber layers that serve an insulation and binding function between the core layers 1110a, 1110b, 1110c, 1110d. Conductive traces 1114a, 1114b and vias 1116a, 1116b, 1116c form electrical couplings within the PCB 1108.

To form the final circuit configuration shown in FIG. 11, a shaft 1118 is drilled into the PCB 1108 and through via 1116b to sever a coupling that had previously existed between via 1116b and conductive trace 1114b. The shaft 1118, in this example, terminates in the core layer 1110b adjacent to the pre-preg layer 1112a through which via 1114a is routed, such that a remaining stub portion 1120 of the via 1116b extends through portions of layers 1112a, 1110b. However, depending on drilling precision, stub length requirements, and/or other considerations, in some implementations the shaft 1118 may terminate in the same layer through which a via is routed (in this example, pre-preg layer 1112a) or more than one layer separated from the layer through which the via is routed (for example, in pre-preg layer 112b or deeper in the PCB 1108).

In some implementations, for any of the fabrication processes described in this disclosure, drilled shafts are filled with a non-conductive potting material (e.g., an epoxy, a plastic, or a rubber) in order to prevent contamination or possible electrical shorts from reaching internal portions of the circuit board.

The relative depths and positions of the conductive traces, vias, and circuit elements shown in FIGS. 7A-7C are merely exemplary; other arrangements compatible with drilling-based reconfigurability are also within the scope of this disclosure.

The selective drilling shown in FIGS. 7B-7C represents a selection of alternative device configurations based on the configurable circuit system 700. In practice, the configurable circuit system 700 may be sold directly to a buyer, who may then perform drilling based on the buyer's needs. Alternatively, the configurable circuit system 700 may be selectively drilled by a manufacturer based on needs of the buyer. The drilling can be performed on an "as-needed" basis, e.g., based on real-time demand from buyers and drawing on an existing stock of configurable circuit systems 700, such that business flexibility and efficiency are increased compared to a situation in which circuit systems 724 and 734 were manufactured through more different processes. The drilling can be performed in response to obtaining an indication of what the final circuit configuration should be.

For example, in some implementations, a first possible final circuit configuration based on an entirely trace-coupled connection (e.g., the final circuit configuration of FIG. 7C) can be analyzed to determine whether signal transmission losses from circuit element 706 to circuit element 706 through conductive traces 718, 720 and the second via 714 exceed a transmission loss threshold. For example, the first final circuit configuration can be fabricated and tested, or can be modeled (e.g., by simulating in a software application).

If the transmission loss threshold is exceeded, an alternative final circuit configuration can be selected, such as the circuit configuration of FIGS. 7B/7D in which a cabled connection may be used to reduce overall transmission losses. If the transmission loss threshold is not exceeded, first possible final circuit configuration is deemed acceptable and selected. The selected final circuit configuration is then fabricated using selective drilling, as described throughout this disclosure.

The example devices shown in FIGS. 7A-7C can be understood in the context of the network switching units described in reference to FIGS. 3-6. The following discussion focuses on a non-limiting example in which the first circuit element 706 is a first integrated circuit (e.g., first integrated circuit 304), the second circuit element 708 is a connection pad, and the third circuit element 710 is an I/O port (e.g., I/O port 310a).

In this context, advances in materials and fabrication may cause conductive trace routes that previously exhibited too-high loss to exhibit acceptable loss. For example, a conductive trace that previously exhibited a prohibitive 7.0 dB loss might exhibit less than 6.875 dB loss if made with a new, experimental PCB material. However, such processes might be unreliable, e.g., exhibit low yield, and it might be undesirable to fabricate units that are entirely dependent on the experimental PCB material working as desired. To avoid this, one might take advantage of reconfigurable circuit systems that can be, at a late stage of processing, converted by drilling either to a conductive trace-coupled configuration (if the experimental trace material works as desired) or to a cabled-and/or second circuit board-coupled configuration (if the experimental trace material does not work as desired).

In this example, circuit system 734 (shown in FIG. 7C) corresponds to a network switching device in which a conductive trace 718 is routed directly from the first circuit element 706 (e.g., an integrated circuit 204 as shown in FIG. 2) to a third circuit element 710 (e.g., an I/O port 210*a* as shown in FIG. 2), without an intervening connector, second circuit board, cable, etc. Such a configuration might be desirable if, for example, losses in the all-conductive-trace connection will be tolerable even in the absence of a cable, retimer, and/or amplifier.

Alternatively, further fabrication steps may be performed subsequent to the alternative steps shown in FIGS. 7B-7C. FIG. 7D shows a circuit system 750 formed from circuit system 724 (shown in FIG. 7B). A connector 752 is bonded to the connection pad of the second circuit element 708 (e.g., soldered to the connection pad). The connector 752 may be any connector described in this disclosure, e.g., a trace-to-cable connector and/or a trace-to-board connector.

In this example, the connector 752 is at least a trace-to-cable connector, and a corresponding cable 754 couples the connector 752 to the I/O port of a third circuit element 710. Circuit system 750, therefore, corresponds to the network switching unit 400 of FIG. 4A. The cable 754 could alternatively connect to a second circuit board to form the network switching units 422, 440 of FIGS. 4B-4C. Or, in some implementations, the connector 752 is at least a trace-to-board connector (e.g., a mezzanine connector), and the network switching units 500, 540 of FIGS. 5A-5B can be formed. Other implementations are also possible, given appropriate components and interconnections.

The third circuit element 710 in FIGS. 7B and 7D may not be the same as the third circuit element 710 in FIG. 7C. Because the third circuit element 710 in FIGS. 7B and 7D receives signals from cable 754 rather than from the third via 716, the third circuit element 710 in FIGS. 7B and 7D need not be electrically coupled to the third via 716. Therefore, a first type of third circuit element can be used in embodiments such as shown in FIG. 7C where the third circuit element 710 receives signals through the third via 716, and a second type of third circuit element, disconnected from the third via 716, can be used in embodiments such as shown in FIGS. 7B and 7D where the third circuit 710 element does not receive signals through the third via 716. The appropriate type of third circuit element 710 can be selected based on the final circuit configuration and mounted subsequent to drilling-based reconfiguration.

In the circuit system 750, although the coupling from the first circuit element 706 to the third circuit element 710 is at least partially cabled, there are still components in the circuit system 750 that are indicative of the fabrication process used to make the circuit system 750. For example, the third via 716 is coupled to the second conductive trace 720, although neither the third via 716 nor the second conductive trace 720 is performing a useful circuit function. As another example, the second conductive trace 720 extends to a floating end 756 at the second shaft 732, without connecting the third via 716 to another component of the circuit system 750.

Figure 8A:
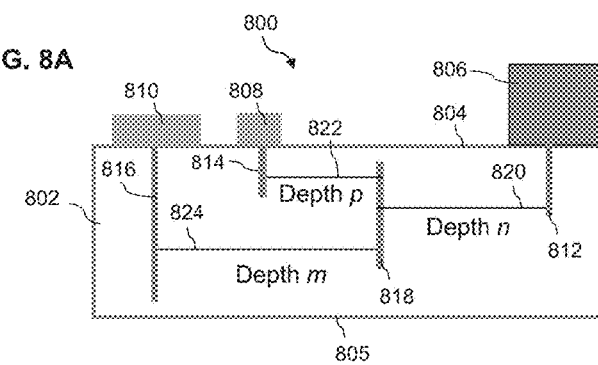
FIGS. 8A-8C show a flowchart of example fabrication processes.
Figure 8B:
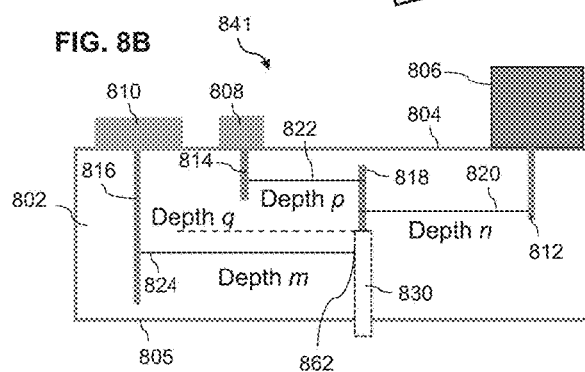
Figure 8C:
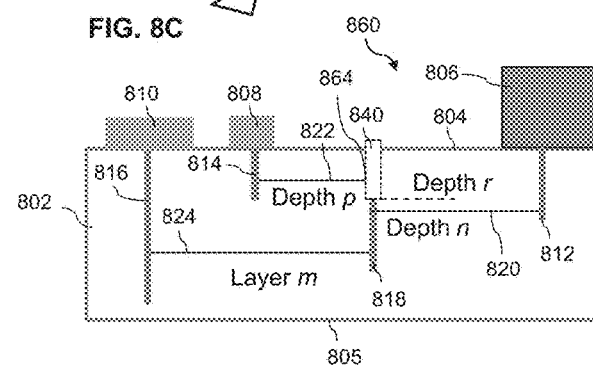

FIGS. 8A-8C show another reconfigurable circuit system and corresponding reconfiguring drilling processes. As shown in FIG. 8A, a circuit system 800 includes a substrate 802 having a first surface 804 and a second, opposite surface 805. A first circuit element 806, a second circuit element 808, and a third circuit element 810 are each disposed at least partially on the first surface 804. The first circuit element 806 is coupled to a first via 812, which is coupled to a first conductive trace 820 disposed at a first depth n with respect to the first surface. The second circuit element 808 may be coupled to a second via 814, which is coupled to a second conductive trace 822 disposed at a second depth p. The third circuit element 810 may be coupled to a third via 816, which is coupled to a third conductive trace 824 disposed at a third depth m. The first, second, and third conductive traces 820, 822, 824 are each coupled to a fourth via 818, which may be, in some implementations, an entirely-buried via inside the substrate 802, or a via that extends to a surface 804 and/or 805. In this example, depth p is less than depth n, and depth n is less than depth m. Each of the vias, circuit elements, and conductive traces may be as described in reference to FIGS. 7A-7C.

As noted in reference to FIGS. 7A-7C, in some cases drilling-based reconfiguration may be performed before mounting of some or all of the circuit elements 806, 808, 810. The circuit elements 806, 808, 810 may then be selected to be appropriate to the final circuit configuration imposed by the drilling-based reconfiguration. Moreover, the circuit elements 806, 808, 810 may themselves be portions of conductive material, bonding pads, or other connectable circuit nodes configured to receive a connection to another circuit component before or after drilling-based reconfiguration.

FIGS. 8B and 8C show alternative drilling procedures used to obtain alternative final circuit configurations. As shown in FIG. 8B, to fabricate a circuit system 841, a first shaft 830, aligned with the fourth via 818, is drilled through the second surface 805, removing conductive material of the fourth via 818. The first shaft 830 extends to a depth q that is larger than depth n and less than depth m, such that the drilling of the first shaft 830 severs the coupling between the third conductive trace 824 and the fourth via 818. Therefore, as a result of the drilling, in the circuit system 841, the first circuit element 806 and the second circuit element 808 are coupled to one another, and the circuit elements 806, 808 are decoupled from the third circuit element 810. The third circuit element 810, in some implementations, is disconnected from the third via 816 and is configured to receive a cabled connection, as described for some implementations of the third circuit element 710 of FIGS. 7B and 7D.

As shown in FIG. 8C, to fabricate a circuit system 860, a second shaft 840, aligned with the fourth via 818, is drilled through the first surface 804, removing conductive material of the fourth via 818. The second shaft 840 extends to a depth r that is larger than depth p and less than depth n, such that the drilling of the second shaft 840 severs the coupling between the second conductive trace 822 and the fourth via 818. Therefore, as a result of the drilling, in the circuit 850, the first circuit element 806 and the third circuit element 810 are coupled to one another, and circuit elements 806, 810 are decoupled from the second circuit element 808. In some implementations, for the final circuit configuration 860 of FIG. 8C, the second circuit element 808 may not be included (e.g., may not be mounted after drilling-based circuit reconfiguration), being superfluous due to the direct electrical coupling between the first and third circuit elements 806, 810.

As described in reference to FIGS. 7A-7C, when the substrate 802 includes a PCB, depths are equivalent to discrete layers in the PCB, and relative layer positions may be configured to accommodate the example drilling processes described herein. For example, n may be larger than or equal to p+1 or p+2, and/or m may be larger than or equal to n+1 n+2; other relative depths are also within the scope of this disclosure.

Moreover, as described in reference to FIG. 7C, the presence of unused circuit components can be indicate of the alternative fabrication processes shown in FIGS. 8A-8C. For example, in FIG. 8B, the third conductive trace 824 extends between the third via 816 and the first shaft 830 and has a floating end 862 at the first shaft 830. In FIG. 8C, the second conductive trace 822 extends between the second via 814 and the second shaft 840 and has a floating end 864 at the second shaft 840. Note that, in some implementations, other drilling steps may, for example, cause the third conductive trace to be decoupled from the third via 816 or may cause the second conductive trace 822 to be decoupled from the second via 814.

Circuit systems may be described as including a "connection path," which refers to an at least partially buried region of a circuit system having at least some conducting material inside of it. A connection path may extend across both depths of a substrate (e.g., as a via) and lengths of a substrate (e.g., as a buried conductive trace). A connection path may include cavities, shafts, and/or tunnels, e.g., drilled cavities or cavities formed by another method. For example, in FIG. 7A, the second via 714 includes conductive material enclosed in a cavity 713 in the substrate 702. An example connection path for FIG. 7A includes the cavity 713 and the second via 714, e.g., the cavity 713 and the conductive material inside the cavity 713. For clarity, cavities are not shown for other vias and conductive traces in the figures of this disclosure, and references to vias and conductive traces, in some examples, implicitly include the cavity enclosing the via or conductive trace.

In some cases, portions of a connection path are continuous with one another, e.g., in some implementations a connection path includes a continuous stretch of substrate and enclosed conducting material.

In FIG. 7B, an example connection path includes the second via 714 and the shaft 722 (with the conducting material being in the via 714). In FIG. 7C, an example connection path includes the second via 714, the first shaft 730, and the second shaft 732.

In FIG. 8A, an example connection path includes the second via 814, the second conductive trace 822, and the fourth via 818. In FIG. 8B, an example connection path includes the second via 814, the second conductive trace 822, the fourth via 818, and the first shaft 830. In FIG. 8C, an example connection path includes the second via 814, the second conductive trace 822, the second shaft 840, and the fourth via 818.

The relative depths and positions of the conductive traces, vias, and circuit elements shown in FIGS. 8A-8C are merely exemplary; other arrangements compatible with drilling-based reconfigurability are also within the scope of this disclosure.

In some implementations, instead of or in addition to drilling shafts that are aligned with vias in order to remove portions of conductive material of the vias, shafts are drilled that remove other conductive portions of connection paths, e.g., a shaft may be drilled to sever a connection by removing a portion of a conductive trace.

Certain circuit board configurations may be particularly useful for deployment as secondary circuit boards in flexible, reconfigurable network switching units such as the network switching units described in this disclosure, or as standalone devices.

Figure 9A:
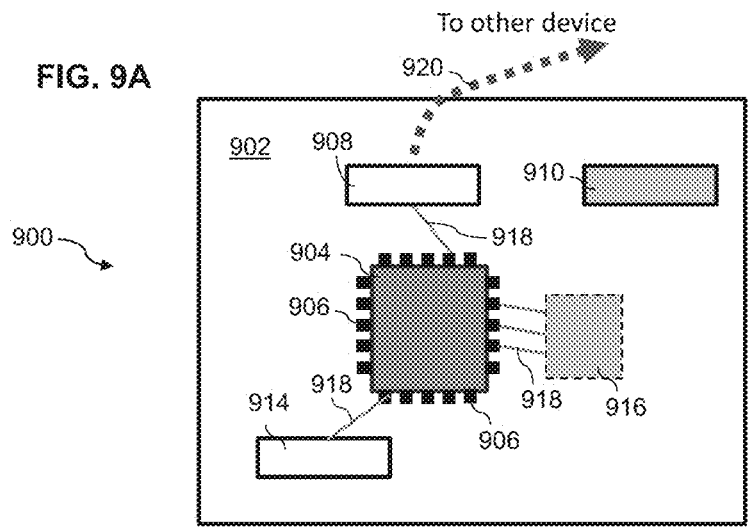
Figure 9B:
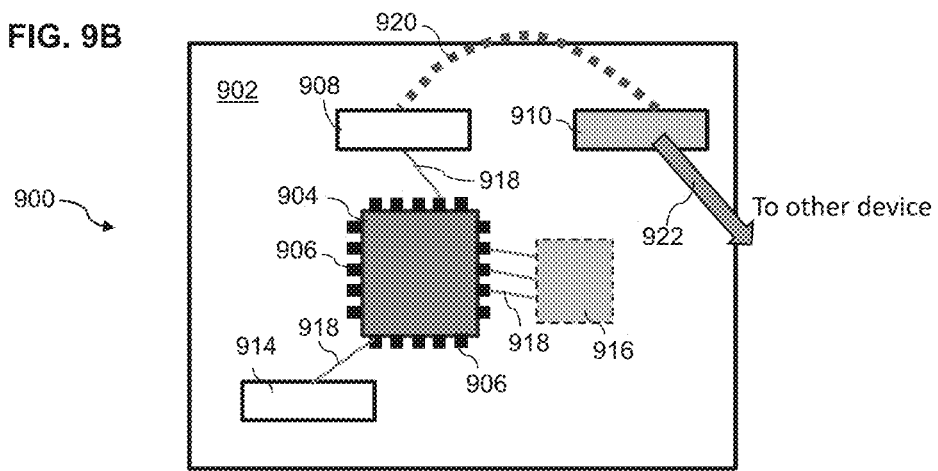

FIGS. 9A-9B show two configurations of a circuit system 900. The circuit system 900 includes a circuit board 902 (e.g., a PCB); an integrated circuit 904, including pins (e.g., pins 906), mounted in or on the circuit board 902; a trace-to-cable connector 908 mounted on the circuit board 902; a cable-to-cable connector 910 mounted on the circuit board 902; a third connector 914 mounted on the circuit board 902; optional auxiliary connector(s) 916 mounted on the circuit board 902; and conductive traces 918 coupling respective pins 906 of the integrated circuit 904 to the trace-to-cable connector 908, the third connector 914, and the auxiliary connectors 916.

The third connector 914 may be any type of connector, including a trace-to-cable connector, a trace-to-board connector (e.g., a mezzanine connector), or another connector, including any connector type described in this disclosure, and may be configured to carry signals in and/or out of the integrated circuit 904. The third connector 914 may be a connector to another device, e.g., another circuit board on which the circuit board 902 is mounted, and/or to a fourth connector (not shown) mounted on the circuit board 902. For example, the third connector 914 may be the third connector 434.

The integrated circuit 904 may be, for example, a PHY or another type of integrated circuit, as described throughout this disclosure.

The trace-to-cable connector 908 is configured to couple to a first cable 920 of a first cable-type, e.g., Twinaxial. For example, the trace-to-cable connector 908 may include pins arranged to mate with corresponding pins in cables of the first cable-type. In some implementations, the trace-to-cable connector 908 includes a Twinaxial grid array (TGA) socket connector.

The cable-to-cable connector 910 is configured to couple the first cable 920 to a second cable 922 of a second cable-type, e.g., Ethernet, InfiniBand, or Fibre Channel. In some implementations, the cable-to-cable connector 910 includes a TGA socket connector, small form-factor pluggable connector (e.g., SFP, QSFP, QSFP-DD or OSFP), or any other connector. For example, the cable-to-cable connector 910 may be configured to couple a Twinaxial cable to a QSFP or a QSFP-DD compatible cable.

In some implementations, the cable-to-cable connector 910 is a passive connector including passive electrical couplings between input and output. In some implementations, the cable-to-cable connector 910 includes active components configured to re-encode, convert, and/or adapt signals transmissible by the first cable-type to signals transmissible by the second cable-type, and vice-versa. When the cable-to-cable connector 910 includes active components, the active components may be powered by connections to the auxiliary connectors 916.

In the configuration shown in FIG. 9A, cable 920 is directly coupled to another device (e.g., to a trace-to-cable connector of another circuit board), and the cable-to-cable connector 910 is not in use. In the configuration shown in FIG. 9B, the cable 920 is coupled to the cable-to-cable connector 910, and the second cable 922 is coupled to another device (e.g., an external device such as an I/O port of a separate network switching unit). Therefore, a high degree of reconfigurability is achieved merely by swapping cables in/out of position.

In some implementations, as shown in FIG. 9C, the third connector 914 is the same connector type as is the trace-to-cable connector 908 (e.g., configured to couple to the first cable-type), and a circuit system 928 includes a fourth connector 930, mounted on the circuit board 902, that is the same connector type as is the cable-to-cable connector 910 (e.g., configured to couple the first cable-type to the second cable-type). Therefore, connection flexibility may be achieved on two distinct paths in and/or out of the circuit system 928. In these implementations, as shown in FIG. 9C if the circuit system 928 is being used as a standalone unit, connections to external devices may be made using the trace-to-cable connector 908 coupled to the cable-to-cable connector 910 by a cable 920 and from there to a first external device, and the third connector 914 coupled to the fourth connector 930 by a cable 932 and from there to a second external device, via appropriate cabling to the external devices compatible with the connectors 910, 930. As shown in FIG. 9D, if the circuit system 928 is being used as a secondary circuit board, connections to a primary circuit board may be made using cables 920, 932 coupled to the trace-to-cable connector 908 and the third connector 914.

In some implementations, the third connector 914 is a trace-to-cable connector configured to couple to the second cable-type.

Figure 10A:
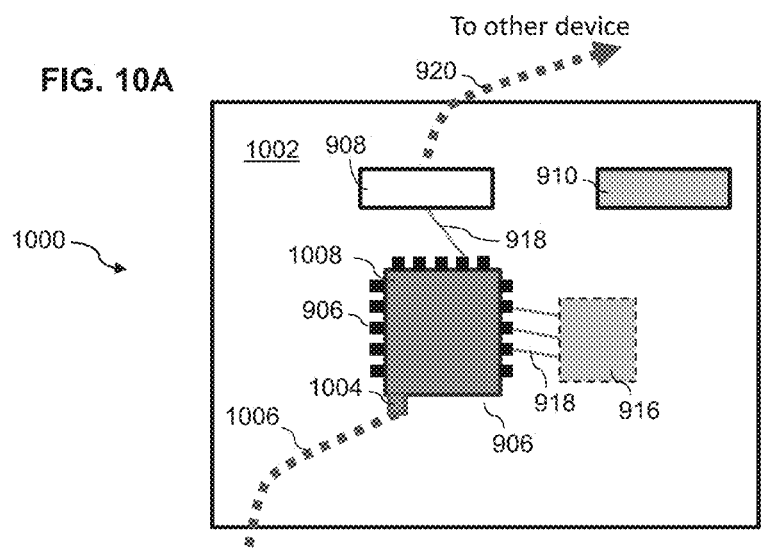
FIGS. 10A-10B show layouts of example circuit systems.
Figure 10B:
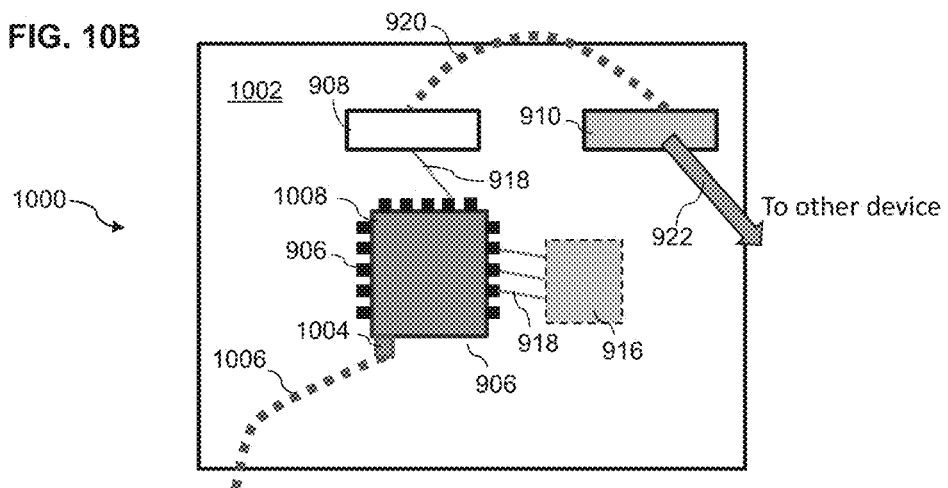

In some implementations, instead of or in addition to the third connector 914 and corresponding conductive traces coupling the third connector 914 to the integrated circuit 904, a circuit system as described for circuit systems 900 or 928 includes an optical connector. For example, FIGS. 10A-10B shown a circuit system 1000 in which an OBO 1008 is mounted on a first circuit board 1002. Other components of the circuit system 1000 operate as described for circuit systems 900 or 928, except where indicated otherwise.

The OBO 1008 includes an optical connector 1004 configured to couple to an optical fiber 1006. In some implementations, the optical fiber 1006 is coupled to an optical port of a network switching unit in which the circuit system 1000 is disposed.

Figure 12:
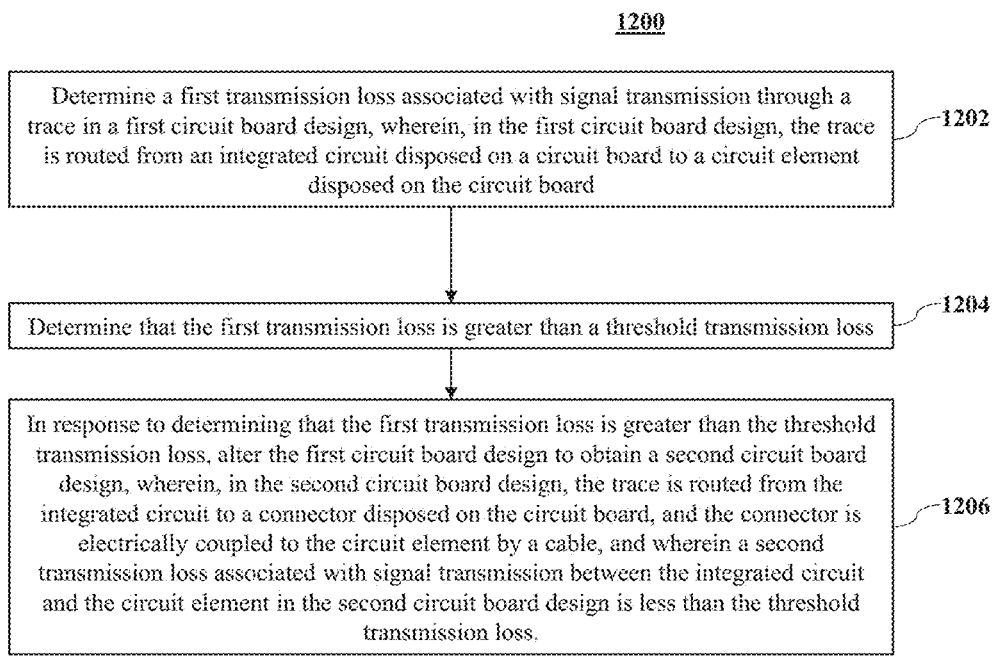
FIG. 12 shows a flowchart of an example design process.

As shown in FIG. 12, in some implementations, in a loss reduction method 1200, a first transmission loss associated with signal transmission through a trace in a first circuit board design is determined (1202). In the first circuit board design, the trace is routed from an integrated circuit disposed on a circuit board to a circuit element disposed on the circuit board. It is determined that the first transmission loss is greater than a threshold transmission loss (1204). In response to determining that the first transmission loss is greater than the threshold transmission loss, the first circuit board design is altered to obtain a second circuit board design (1206). In the second circuit board design, the trace is routed from the integrated circuit to a connector disposed on the circuit board, and the connector is electrically coupled to the circuit element by a cable. A second transmission loss associated with signal transmission between the integrated circuit and the circuit element in the second circuit board design is less than the threshold transmission loss.

Figure 13:
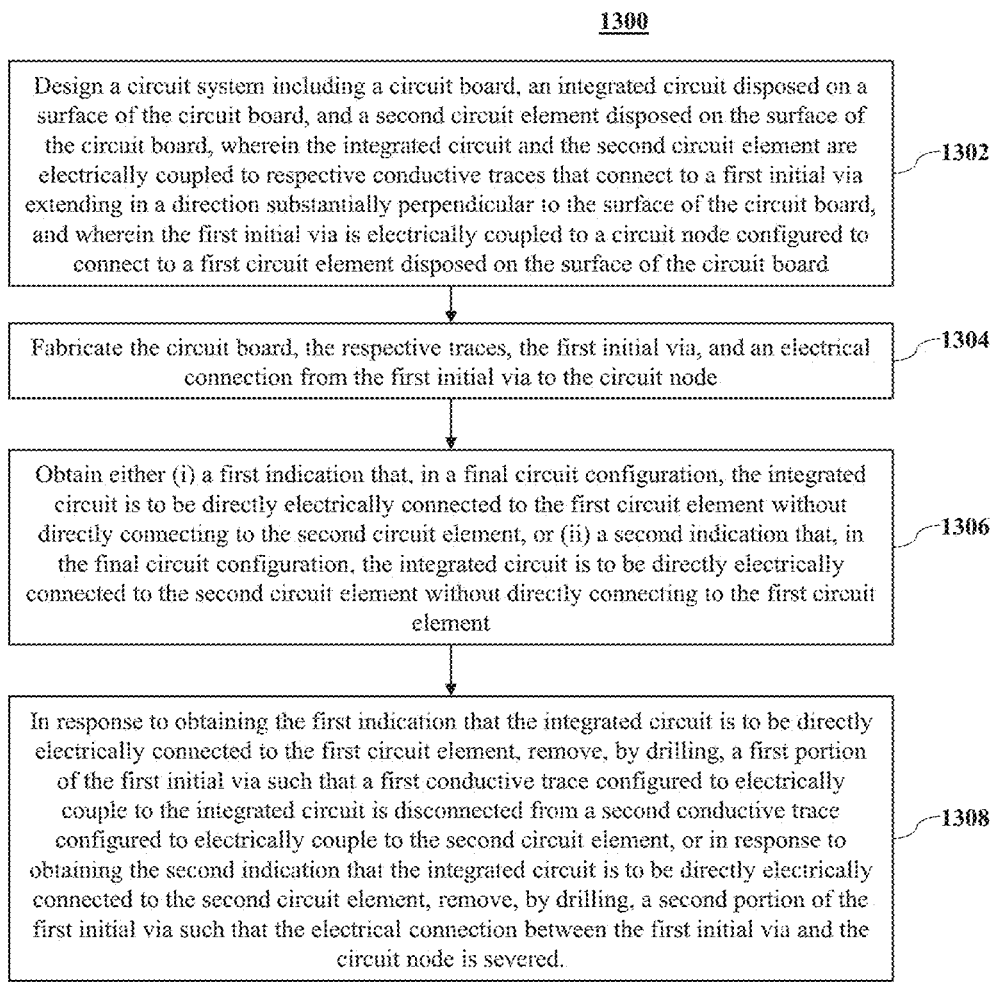

As shown in FIG. 13, in some implementations, in a circuit fabrication method 1300, a circuit system is designed including a circuit board, an integrated circuit disposed on a surface of the circuit board, and a second circuit element disposed on the surface of the circuit board (1302). The integrated circuit and the second circuit element are electrically coupled to respective conductive traces that connect to a first initial via extending in a direction substantially perpendicular to the surface of the circuit board, and the first initial via is electrically coupled to a circuit node configured to connect to a first circuit element disposed on the surface of the circuit board. The circuit board, the respective traces, the first initial via, and an electrical connection from the first initial via to the circuit node are fabricated (1304). Either (i) a first indication is obtained that, in a final circuit configuration, the integrated circuit is to be directly electrically connected to the first circuit element without directly connecting to the second circuit element, or (ii) a second indication is obtained that, in the final circuit configuration, the integrated circuit is to be directly electrically connected to the second circuit element without directly connecting to the first circuit element (1306). In response to obtaining the first indication that the integrated circuit is to be directly electrically connected to the first circuit element, a first portion of the first initial via is removed by drilling, such that a first conductive trace configured to electrically couple to the integrated circuit is disconnected from a second conductive trace configured to electrically couple to the second circuit element (1308). Or, in response to obtaining the second indication that the integrated circuit is to be directly electrically connected to the second circuit element, a second portion of the first initial via is removed by drilling, such that the electrical connection between the first initial via and the circuit node is severed (1308).

Figure 14:
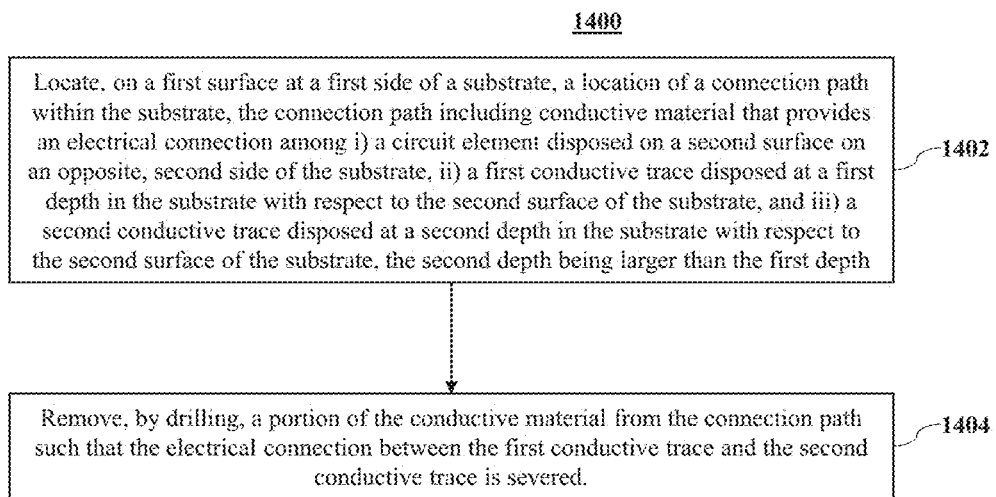

As shown in FIG. 14, in some implementations, in a circuit fabrication method 1400, on a first surface at a first side of a substrate, a location of a connection path within the substrate is located (1402). The connection path includes conductive material that provides an electrical connection among i) a circuit element disposed on a second surface on an opposite, second side of the substrate, ii) a first conductive trace disposed at a first depth in the substrate with respect to the second surface of the substrate, and iii) a second conductive trace disposed at a second depth in the substrate with respect to the second surface of the substrate, the second depth being larger than the first depth. A portion of the conductive material is removed from the connection path by drilling, such that the electrical connection between the first conductive trace and the second conductive trace is severed (1404).

Figure 15:
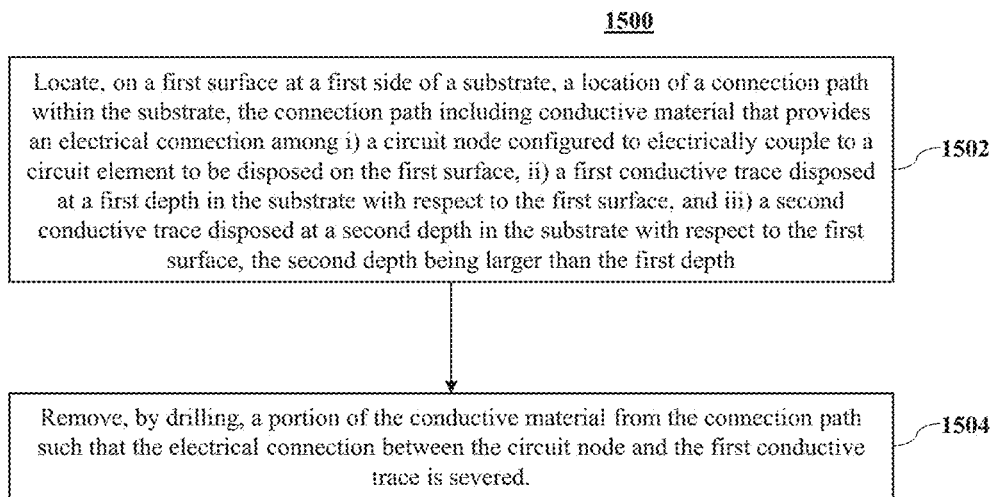

As shown in FIG. 15, in some implementations, in a circuit fabrication method 1500, on a first surface at a first side of a substrate, a location of a connection path within the substrate is located (1502). The connection path includes conductive material that provides an electrical connection among i) a circuit node configured to electrically couple to a circuit element to be disposed on the first surface, ii) a first conductive trace disposed at a first depth in the substrate with respect to the first surface, and iii) a second conductive trace disposed at a second depth in the substrate with respect to the first surface, the second depth being larger than the first depth. A portion of the conductive material is removed from the connection path by drilling, such that the electrical connection between the circuit node and the first conductive trace is severed (1504).

As shown in FIG. 16, in some implementations, in a circuit fabrication method 1600, in a circuit board, a first initial via is fabricated extending from a surface of the circuit board in a direction substantially perpendicular to the surface of the circuit board, the first initial via configured to provide an electrical connection to an integrated circuit (1602). In the circuit board, a second initial via is fabricated extending in a direction substantially perpendicular to the surface of the circuit board, the second initial via configured to provide an electrical connection to a circuit node for a first circuit element (1604). In the circuit board, a third initial via is fabricated extending from the surface of the circuit board in a direction substantially perpendicular to the surface of the circuit board, the third initial via configured to provide an electrical connection to a second circuit element (1606). A first conductive trace is fabricated disposed at a first depth in the circuit board with respect to the surface, the first conductive trace configured to electrically couple the first initial via with the second initial via (1608). A second conductive trace is fabricated disposed at a second depth in the circuit board with respect to the surface, the second conductive trace configured to electrically couple the second initial via with the third initial via (1610). Either (i) a first indication is obtained that, in a final circuit configuration, the integrated circuit is to be directly electrically connected to the first circuit element without directly electrically connecting to the second circuit element, or (ii) a second indication is obtained that, in the final circuit configuration, the integrated circuit is to be directly electrically connected to the second circuit element without directly electrically connecting to the first circuit element (1612). In response to obtaining the first indication that the integrated circuit is to be directly electrically connected to the first circuit element, a first portion of the second initial via is removed by drilling, such that an electrical connection between the first conductive trace and the second conductive trace is severed (1614). Or, in response to obtaining the second indication that the integrated circuit is to be directly electrically connected to the second circuit element, a second portion of the second initial via is removed by drilling, such that an electrical connection between the first conductive trace and the circuit node is severed (1614).

A number of implementations have been described. Nevertheless, it will be understood that various modifications may be made without departing from the spirit and scope of this disclosure. For example, features described above in connection with different embodiments may be combined in the same implementation. Further, some features described above may be omitted in some implementations. Accordingly, other implementations are within the scope of the claims.

What is claimed is:

1. A loss reduction method comprising:
   determining a first transmission loss associated with signal transmission through a trace in a first circuit board design, wherein, in the first circuit board design, the trace is routed from an integrated circuit disposed on a circuit board to a circuit element disposed on the circuit board;
   determining that the first transmission loss is greater than a threshold transmission loss; and
   in response to determining that the first transmission loss is greater than the threshold transmission loss, altering the first circuit board design to obtain a second circuit board design,
      wherein, in the second circuit board design, the trace is routed from the integrated circuit to a connector disposed on the circuit board, and the connector is electrically coupled to the circuit element by a cable, and
      wherein a second transmission loss associated with signal transmission between the integrated circuit and the circuit element in the second circuit board design is less than the threshold transmission loss.

2. The method of claim 1, wherein the second transmission loss is less than 6.875 dB for network transmission signals having a speed of at least 112 Gbit/second.

3. The method of claim 2, wherein the second transmission loss is less than 4.875 dB for network transmission signals having a speed of at least 112 Gbit/second.

4. The method of claim 1, comprising altering the second circuit board design to obtain a third circuit board design, wherein, in the third circuit board design, a second circuit element is electrically coupled between the connector and the circuit element,
   wherein the second circuit element contributes net transmission loss to signal transmission between the integrated circuit and the circuit element, and
   wherein a third transmission loss associated with signal transmission between the integrated circuit and the circuit element in the third circuit board design, including the net transmission loss contributed by the second circuit element, is less than the threshold transmission loss.

5. The method of claim 1, wherein altering the first circuit board design to obtain the second circuit board design comprises locating the connector closer to the integrated circuit than to the circuit element.

6. The method of claim 1, wherein altering the first circuit board design to obtain the second circuit board design comprises locating the connector such that a third signal transmission loss associated with signal transmission between the integrated circuit and the connector is less than a second threshold transmission loss.

7. The method of claim 6, wherein a difference between the threshold transmission loss and the second threshold transmission loss is greater than or equal to a fourth signal transmission loss associated with operation of a circuit device that is connectable to the connector by the cable.

8. The method of claim 1, wherein the connector comprises a trace-to-cable connector.

9. The method of claim 1, wherein the circuit element comprises an input/output (I/O) port.

* * * * *